(12) United States Patent
Yuasa

(10) Patent No.: US 8,118,633 B2
(45) Date of Patent: Feb. 21, 2012

(54) COLOR IMAGE DISPLAY PANEL AND METHOD OF PRODUCING THE SAME, AND COLOR IMAGE DISPLAY APPARATUS

(75) Inventor: Satoshi Yuasa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 523 days.

(21) Appl. No.: 12/060,390

(22) Filed: Apr. 1, 2008

(65) Prior Publication Data

US 2008/0290794 A1 Nov. 27, 2008

(30) Foreign Application Priority Data

Apr. 3, 2007 (JP) ................................ 2007-097408
Mar. 7, 2008 (JP) ................................ 2008-057395

(51) Int. Cl.
*H01L 27/32* (2006.01)
*H01J 9/00* (2006.01)

(52) U.S. Cl. ........................................... 445/24; 445/23
(58) Field of Classification Search .......... 313/498–512; 445/23–25
See application file for complete search history.

(56) References Cited

U.S. PATENT DOCUMENTS

| 6,787,987 B2 * | 9/2004 | Duineveld et al. ............. 313/500 |
| 2007/0285006 A1 * | 12/2007 | Satoh et al. ................... 313/504 |
| 2008/0001536 A1 * | 1/2008 | Tsai et al. ..................... 313/506 |

FOREIGN PATENT DOCUMENTS

| JP | 2002110345 A | * | 4/2002 |
| JP | 2004516630 T | | 6/2004 |

* cited by examiner

*Primary Examiner* — Joseph L Williams
*Assistant Examiner* — Nathaniel Lee
(74) *Attorney, Agent, or Firm* — Fitzpatrick, Cella, Harper & Scinto

(57) ABSTRACT

There is provided an organic electroluminescence type two-dimensional color image display panel includes multiple arrayed pixels, the pixels being each formed by arranging organic EL devices having at least red, green, and blue luminescent colors in a certain order, in which each of the organic EL devices has a pair of two parallel sides in a planar shape, the organic EL devices having luminescent colors different from each other are adjacent to each other at the two parallel sides, and the organic EL devices having the same luminescent color are adjacent to each other in a parallel line direction of the two parallel sides, and are arrayed to be of shape of stripes arranged parallel to each other while being slanted with respect to a vertical line.

5 Claims, 12 Drawing Sheets

PRIOR ART

PRIOR ART

PRIOR ART

COLOR IMAGE DISPLAY PANEL AND METHOD OF PRODUCING THE SAME, AND COLOR IMAGE DISPLAY APPARATUS

BACKGROUND OF THE INVENTION

1. Field of the Invention

The present invention relates to a color image display panel obtained by arraying multiple organic electroluminescence devices (organic EL devices) each having such a structure that a first electrode, a layer containing at least one kind of a low-molecular-weight luminous organic compound, and a second electrode are laminated in the stated order on a substrate and a method of producing the color image display panel, and a color image display apparatus using the color image display panel.

2. Description of the Related Art

A known organic EL device has such a structure that a first electrode formed on a substrate, an organic compound layer formed on the first electrode, and a second electrode formed on the organic compound layer are laminated.

FIGS. 11A and 11B are each schematic views illustrating an example of an image display panel on which organic EL devices are arrayed in a matrix fashion. FIG. 11A is a plan view illustrating the array of the respective pixels. FIG. 11B is a sectional view taken along the line 11B-11B of FIG. 11A. In each of FIGS. 11A and 11B, reference numeral 101 represents a substrate, 102 represents a first electrode, 103 represents an organic compound layer, and 104 represents a second electrode. In addition, reference numeral 105 represents a pixel specified by a region where the organic compound layer is interposed between the first electrode 102 and the second electrode 104.

Each of FIGS. 11A and 11B shows an example in which dot-shaped organic EL devices as pixels are arrayed on the surface of the substrate 101 in a matrix fashion, and each of the organic EL devices is formed so as to be capable of emitting light independently. The image display panel can display various images by appropriately selecting an organic EL device to be caused to emit light.

FIG. 12 shows an example of a sectional view of an image display panel having such a constitution that a device isolation film 110 is formed around each organic EL device 105 to prevent currents from crossing and flowing between adjacent devices. In FIG. 12, a protective layer 111 is further formed on the surface of each device, which prevent infiltration of water, air, or the like into a device portion from an environmental surrounding.

Examples of the shapes and array of multicolor sub-pixels when the sub-pixels are used as one group for forming a color image display panel will be described.

FIGS. 13A to 13C are each a plan view illustrating the array of sub-pixels. FIG. 13A out of FIGS. 13A to 13C is a schematic view illustrating the array of sub-pixels referred to as a stripe array. Devices having red, green, and blue luminescent colors are formed so as to be adjacent to one another because three primary colors are needed in a full-color image display panel. A group using the three adjacent devices as sub-pixels forms a pixel. When the colors of the sub-pixels are distinguished from one another in each of FIGS. 13A to 13C, red, green, and blue colors are represented by symbols R, G, and B, respectively. The same is applied to the following description.

Because a square pixel is typically used in the display of a computer, the sub-pixels are each formed into a rectangle having a long side-to-short side ratio of about 3, and sub-pixels adjacent to each other in the short side direction of the rectangle are defined as a pixel in many cases. Japanese Patent Application Laid-Open No. 2002-110345 refers to a method of producing a full-color organic EL image display panel having sub-pixels arrayed in a stripe fashion by using a stripe-shaped mask.

Even when sub-pixels having four or more kinds of luminescent colors (including a white color) are defined as one pixel for the purpose of, for example, obtaining brightness or extending the range of colors that can be displayed, a pixel is generally formed of a group of rectangular sub-pixels adjacent to each other in their short side directions. For example, even when there is no need for displaying full colors, and only two kinds of sub-pixels are used, a pixel is generally formed of a group of rectangular sub-pixels adjacent to each other in their short side directions.

FIG. 13B is a schematic view illustrating another array of sub-pixels referred to as an RGB delta array. The delta array is characterized in that a color array in an odd row deviates from that in an even row by a 1/2 pitch. An excellent resolution is achieved when a natural image is displayed on a portable, small display where the number of pixels is restricted.

The array of sub-pixels shown in FIG. 13C and referred to as a scramble array in which an array of sub-pixels in the upper row deviates from that in an n-th row by a 1/3 pitch is also similarly known.

Japanese Patent Application Laid-Open No. 2004-516630 proposes a display panel in which the positional constitution of the colors of sub-pixels in a pixel differs from that in an adjacent pixel with a view to improving the quality of a display image. In addition, the document discloses that when an electroluminescence material is deposited by an ink-jet printing step, the material is continuously deposited in a line shape slanted with respect to a pixel array, whereby the thickness of a deposited layer can be stabilized, and, furthermore, a display panel in which the positional constitution of the colors of sub-pixels in a pixel differs from that in any other pixel can be obtained.

FIG. 14 is a perspective view for describing a general step of producing a color image display panel by a vacuum deposition method through a mask. In FIG. 14, the same reference numerals as those of FIGS. 11A, 11B, 11C and 12 represent the same members as those of FIGS. 11A, 11B, 11C and 12, and reference numerals 201 and 202 represent a mask and a through-hole, respectively. In the example shown in the figure, the through-holes 202 of the mask 201 are each formed so as to coincide with the position of a sub-pixel having one specific luminescent color in the delta array.

An active matrix drive circuit (not shown) and the first electrode 102 connected to the circuit are formed on the substrate 101. The organic compound layer 103 capable of emitting red, green, or blue light is formed on the resultant through each through-hole 202 of the mask 201. Next, the mask 201 is shifted in a horizontal direction toward the position of an adjacent sub-pixel, and the organic compound layer 103 capable of emitting light having a luminescent color different from that of light emitted from the organic compound layer 103 previously formed is formed on the sub-pixel through the through-hole 202 of the mask 201. The foregoing operation is repeated three times, whereby the organic compound layers 103 corresponding to the respective red, green, and blue colors are each deposited at a predetermined position. Finally, the second electrode 104 is formed on the entirety of the resultant, and, as required, the protective layer 111 is further formed on the electrode, whereby the color image display panel is obtained.

FIG. 15 is a sectional view of the mask 201 taken along the line 15-15 of FIG. 14. The width of a sub-pixel is reduced so as to be comparable to the thickness of the mask 201 in a color image display panel having a high resolution. When a material emitter of such a large size that vacuum deposition can be rapidly performed is used, the thickness of the mask 201 must be reduced in order that the extent to which the thickness of a deposit at the center of the small through-hole 202 of the mask 201 differs from that at the peripheral portion of the through-hole may be alleviated. However, the mask 201 typically requires a thickness of at least about several tens of micrometers in order that the durability and handleability of the mask itself may be secured. In view of the foregoing, the following mask is used: a shaved portion 203 is formed so that each through-hole 202 expands on the material emitter side of the mask 201 as shown in FIG. 15, whereby the thickness of the peripheral portion of the through-hole 202 is reduced while the thickness of the mask 201 is increased so that the strength of the mask is secured.

When the array of rectangular sub-pixels is the above delta array or the above scramble array in a color image display panel on which organic EL devices having two or more kinds of different luminescent colors are arrayed, a vacuum deposition step involving the use of a mask involves the following problem.

FIGS. 16A and 16B are each a schematic view illustrating a mask for a vacuum deposition step for arraying sub-pixels in a delta array. FIG. 16A is a plan view illustrating the mask when viewed from its material emitter side, and FIG. 16B is a sectional view taken along the line 16B-16B of FIG. 16A. When each shaved portion 203 is formed so that each through-hole 202 expands toward the material emitter side as described above, the respective shaved portions 203 interfere with each other at a portion where the corners of the through-holes 202 are close to each other, whereby a portion where the thickness of the mask 201 is significantly small is formed.

As a result, the mask involves a problem in terms of strength: the mask is apt to split in a specific direction when an external force is applied to the mask. The production of a mask itself having an insufficient strength wastes a time period and a cost, and the number of times the mask can be repeatedly used in a vacuum deposition step reduces. In addition, the mask cannot be fixed to a jig by applying a sufficient tension, so the accuracy of position of the vacuum deposition step becomes low, and the yield in which a high-definition image display panel is produced reduces. In the case of the scramble array, a portion where the shaved portions 203 interfere with each other particularly strongly (not shown) is present, so the resultant mask is apt to tear particularly in an oblique direction, and it becomes additionally difficult to produce a mask that can be put into practical use.

The strength of the mask can be secured by reducing the size of each through-hole 202 so that the above interference does not occur. However, the area of each sub-pixel reduces, so the current density of a device must be increased in order that light with predetermined brightness may be emitted, and the increase adversely affects the luminous current efficiency and driving lifetime of an image display panel.

In short, a color image display panel which: is produced by employing a vacuum deposition step as described above; and has sub-pixels arrayed in a delta array or a scramble array involves problems to be solved in terms of, for example, yield, cost, performance, and lifetime. An image display apparatus using the image display panel as a component inherits the problems, so the apparatus involves problems in terms of, for example, cost, performance, and lifetime.

In other words, a conventional color image display panel having rectangular sub-pixels arrayed in a delta array or a scramble array involves the following problem: it is difficult to increase the opening ratio of each sub-pixel when the sub-pixel is produced by a vacuum deposition step involving the use of a mask. The problem is due to the presence of a portion where the corner portions of sub-pixels are close to each other. The problem described here is remarkable when a color image display panel is produced by a vacuum deposition step involving the use of a mask having a large opening ratio.

SUMMARY OF THE INVENTION

The present invention provides a color image display panel which has solved such problems as described above and has display performance comparable to that of an image display panel in which the array of sub-pixels is, for example, a delta array or a scramble array and provides a method of producing the color image display panel, and a color image display apparatus using the color image display panel. Further, the present invention provides a color image display panel that can be produced by a vacuum deposition step including the use of a mask involving no problem in terms of strength and a method of producing the color image display panel, and a color image display apparatus using the color image display panel.

In order to solve the above problems, a color image display panel of the present invention provides an organic electroluminescence type two-dimensional color image display panel including multiple pixels arrayed and each formed by arranging organic EL devices having at least red, green, and blue luminescent colors in a certain order, the organic EL devices being each obtained by depositing an organic light emitting layer by a vacuum deposition method onto a first electrode formed on a substrate and by further forming a second electrode on the organic light emitting layer, in which; each of the organic EL devices has a pair of two parallel sides in a planar shape; the organic EL devices having luminescent colors different from each other are adjacent to each other at the two parallel sides; and the organic EL devices having the same luminescent color are adjacent to each other in a parallel line direction of the two parallel sides, and are arrayed to be in the shape of stripes arranged parallel to each other while being slanted with respect to a vertical line.

In addition, a method of producing an organic electroluminescence type two-dimensional color image display panel of the present invention includes; forming multiple first electrodes two-dimensionally arrayed on a substrate; depositing an organic light emitting material having at least red, green, and blue luminescent colors at positions where the multiple first electrodes are formed through multiple through-holes of a mask having the multiple through-holes for each luminescent color; and forming a second electrode, in which; in the formation of the multiple first electrodes, the multiple first electrodes each having a planar shape with a pair of two parallel sides are one-dimensionally arrayed so that a first side of the two parallel sides of each electrode is aligned with a straight line, and a second side of the two parallel sides of the electrode is also aligned with a straight line, and the multiple first electrodes are two-dimensionally arrayed so that one-dimensional arrays of the multiple first electrodes are in the shape of stripes arranged parallel to each other while being slanted with respect to a vertical line; and in the deposition of the organic light emitting materials, the mask in which the multiple through-holes are formed into shape of stripes to correspond to stripes obtained by forming the multiple first electrodes is aligned so that the stripes obtained by forming the multiple first electrodes and the multiple through-holes of the mask are opposed to each other before the organic light emitting materials are deposited.

According to the present invention, a color image display panel having natural image display performance comparable to that of an image display panel in which the array of sub-pixels is a delta array or a scramble array can be produced by utilizing a mask which has a stripe-shaped through-hole and is produced easily. As a result, a color image display panel excellent in, for example, cost performance, performance such as the brightness of a display image, and lifetime can be obtained.

In addition, according to the present invention, a method of producing an image display panel having natural image display performance comparable to that of an image display panel in which the array of sub-pixels is a delta array or a scramble array can be reduced in production cost and improved in yield because a mask which can be easily produced and has durability is utilized in the method.

Further, according to the present invention, an organic electroluminescence type color image display apparatus which: has natural image display performance comparable to that of an image display apparatus in which the array of sub-pixels is a delta array or a scramble array; and is excellent in, for example, cost performance, performance such as the brightness of a display image, and lifetime can be obtained.

Further features of the present invention will become apparent from the following description of exemplary embodiments with reference to the attached drawings.

DESCRIPTION OF THE EMBODIMENTS

Figure 1:
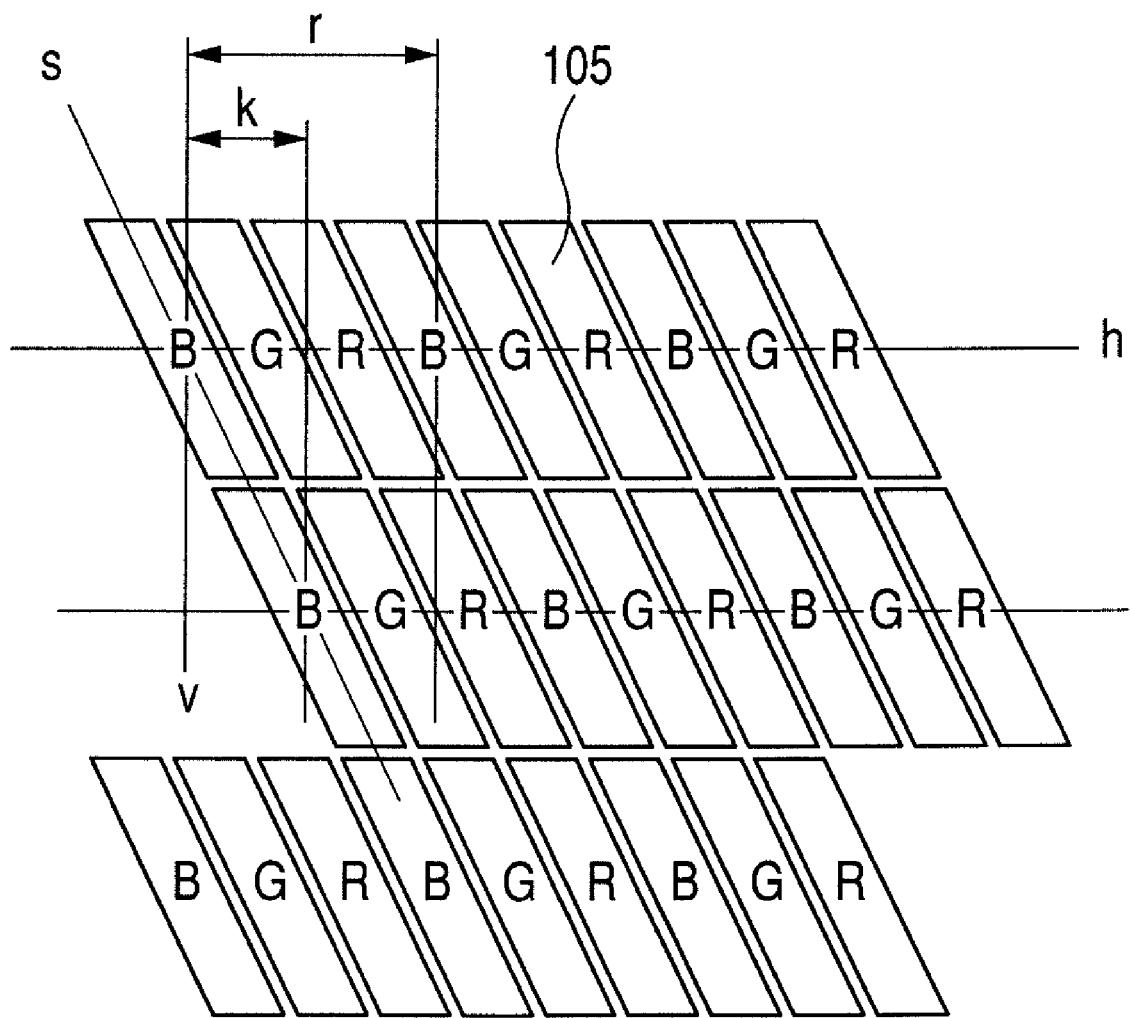
FIG. 1 is a plan view illustrating examples of a shape and array of sub-pixels of an image display panel of the present invention.

FIG. 1 is a schematic plan view illustrating an embodiment of a color image display panel (which may hereinafter be simply abbreviated as "image display panel") of the present invention.

The shown image display panel is an organic EL type two-dimensional color image display panel on which multiple pixels are arrayed. The pixels are each formed by arranging organic EL devices having red, green, and blue luminescent colors in a certain order. The organic EL devices are each obtained by: depositing an organic light emitting layer by a vacuum deposition method onto a first electrode formed on a substrate; and further forming a second electrode on the organic light emitting layer.

Each organic EL device has a pair of two parallel sides in its planar shape. By the way, in this embodiment, an organic EL device having a shape of parallelogram is used. Therefore, the device has a pair of parallel long sides and a pair of parallel short sides, and the center of gravity of the device in the plane is equidistant from two parallel sides.

Organic EL devices having luminescent colors different from each other are adjacent to each other at their long sides, and organic EL devices having the same luminescent color are adjacent to each other at their short sides (that is, in the parallel line direction of parallel long sides). The organic EL devices having the same luminescent color are arrayed in a stripe fashion so that a first straight line s connecting the positions of the centers of gravity of the organic EL devices is parallel to the long sides of the organic EL devices. Stripes each obtained by arraying the organic EL devices are arranged so as not to overlap each other and so as to be parallel to each other while being slanted with respect to a vertical line v.

In particular, in this embodiment, pixels are each formed by using the organic EL devices having red, green, and blue luminescent colors and arrayed so as to be adjacent to one another in a horizontal direction as a group of sub-pixels 105. In addition, the pixels adjacent to each other in the horizontal direction are arrayed so that a second straight line h connecting the positions of the centers of gravity of the pixels is parallel to the horizontal line. In addition, each sub-pixel 105 is placed so that a short side of the sub-pixel is parallel to the horizontal line.

In short, the position of the center of gravity of each sub-pixel 105 formed of organic EL devices each having a shape of parallelogram is aligned with the straight line (second straight line) h drawn in the horizontal direction, and, furthermore, a pair of two parallel sides of the sub-pixel is aligned with the direction of the oblique line (first straight line) s. The organic EL devices having the same luminescent color are arrayed in a stripe fashion so as to be arranged in the direction of the oblique line s. The oblique line s is slanted with respect to the vertical line v.

It should be noted that each organic EL device has the organic light emitting layer, and the first and second electrodes, and each device can be individually driven by connecting, for example, wiring and a transistor for driving these electrodes (not shown). Here, in consideration of the tradition of the display of a two-dimensional image with a television signal, the direction in which pixel data is collectively written in a fast period is referred to as a horizontal direction, and the direction in which image data is repeatedly written in a slower period than that of the collective writing while the position of the image data is sequentially shifted is referred to as a vertical direction. The terms "horizontal line" and "vertical line" as used herein mean a straight line in the horizontal direction and a straight line in the vertical direction, respectively.

The magnitude of the slope of the array of the sub-pixels 105, that is, the slope of the first straight line s can be derived as described below. That is, the magnitude can be derived from a value for a ratio k/r of a deviation amount k in the horizontal direction between the position of the center of gravity of any one of the sub-pixels 105 and the position of the center of gravity of a sub-pixel adjacent to the sub-pixel 105 in the vertical direction and having the same luminescent color as that of the sub-pixel 105 to a repetition pitch r of sub-pixels adjacent to each other in the horizontal direction and having the same luminescent color. FIG. 1 shows an example in which a value for the slope is 1/2.

Figure 13A:
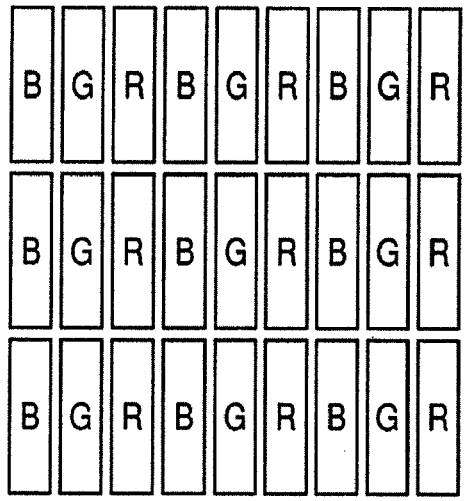
FIGS. 13A, 13B, and 13C are each a plan view illustrating the shape and array of the sub-pixels of a conventional image display panel, FIG. 13A being a plan view illustrating a stripe array, FIG. 13B being a plan view illustrating a delta array, and FIG. 13C being a plan view illustrating a scramble array.
Figure 13B:
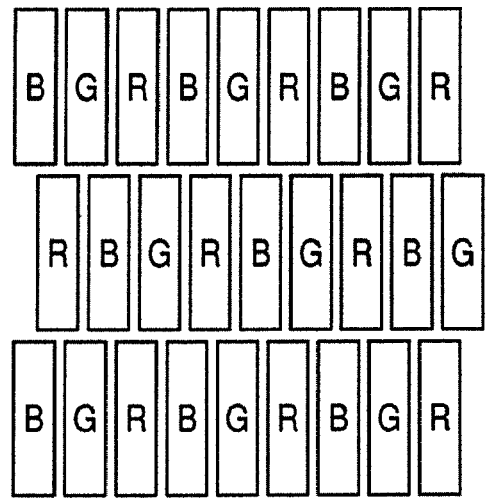
Figure 13C:
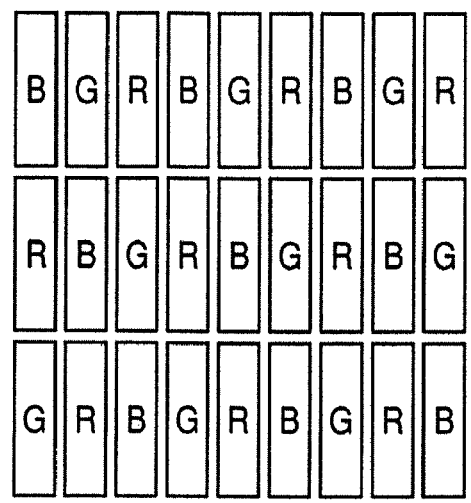
Figure 14:
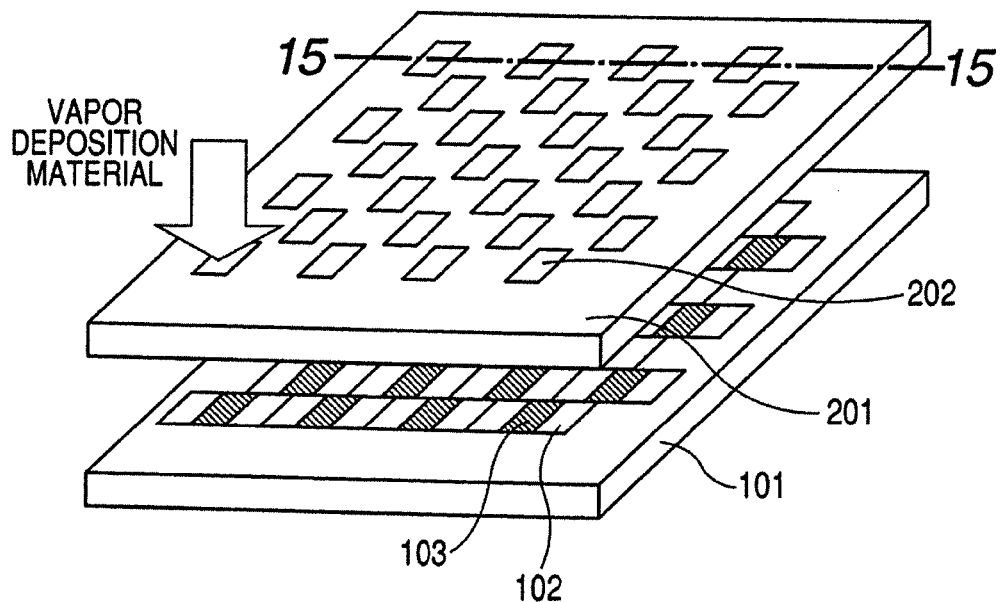
FIG. 14 is a perspective view schematically illustrating the manner in which the organic compound layer of an organic EL device is formed by a conventional method.
Figure 15:
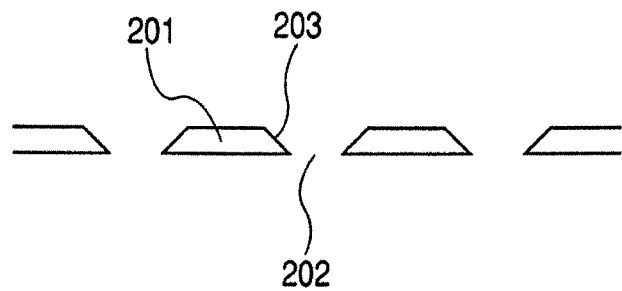
FIG. 15 is a schematic view illustrating the section of a conventional mask.
Figure 16A:
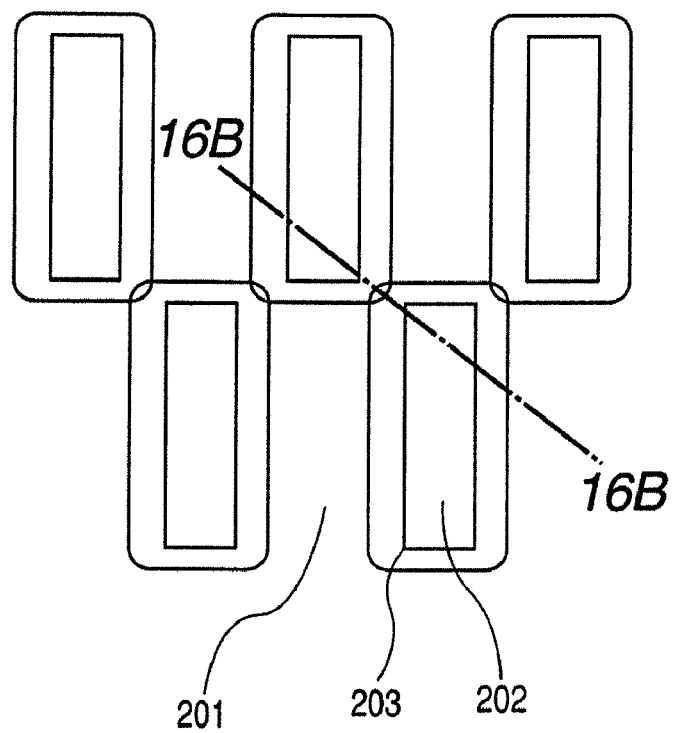
FIGS. 16A and 16B are each a schematic view illustrating an example of a mask for an image display panel having rectangular sub-pixels arrayed in a delta array, FIG. 16A being a plan view illustrating the mask when viewed from its material emitter side, and FIG. 16B being a sectional view taken along the line 16B-16B of FIG. 16A.
Figure 16B:
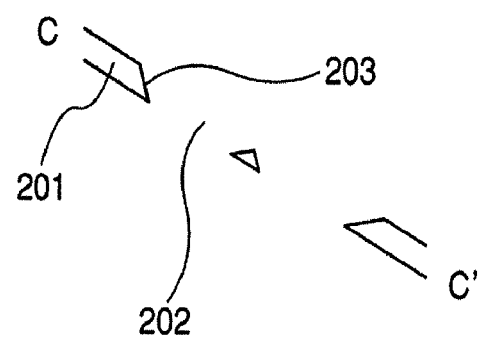

When the value for the slope is 1/2, the positions of the centers of gravity of the sub-pixels 105 each having a shape of parallelogram are identical to the positions of the centers of gravity of rectangular sub-pixels arrayed in a delta array schematically exemplified in FIG. 13B. Therefore, an image display panel having the array can display a color image comparable to that of a conventional image display panel having rectangular sub-pixels arrayed in a delta array by supplying driving data comparable to that of the conventional panel at a driving timing comparable to that of the conventional panel.

That is, an image display panel having the shape and array of the sub-pixels 105 shown in FIG. 1 can be replaced with an image display panel having rectangular sub-pixels arrayed in a delta array. A conventional circuit can be utilized as an image display panel control circuit or control integrated circuit for producing a driving signal for each sub-pixel from an image input signal. In addition, when a substrate with an active matrix circuit in which a transistor for driving the first electrode is formed is used as the substrate, a circuit having the same design as that of an active matrix circuit for driving rectangular sub-pixels arrayed in a delta array can be used. The shapes and array of the first electrodes and the organic light emitting layer to be formed on the active matrix circuit have only to be those exemplified in FIG. 1.

FIG. 1 shows an example in which a long side of each of the sub-pixels 105 each having a shape of parallelogram is slanted in the left direction of the screen of the image display panel; it is obvious that the positions of the centers of gravity of the sub-pixels similarly correspond to the positions of the centers of gravity of rectangular sub-pixels arrayed in a delta array even when the long side is slanted in the right direction.

In addition, FIG. 1 shows the case where the order in which the colors of the sub-pixels 105 are arranged is an order "B, G, and R" from the left; of course, no problem arises even when the order is, for example, an order "R, G, and B".

Further, the foregoing discussion holds true for the case where one pixel is formed of four sub-pixels by adding a sub-pixel having a color except the three primary colors in order that a color display range may be extended. When a pitch in the horizontal direction for the four sub-pixels is represented by r, and a deviation amount between the positions of the centers of gravity of sub-pixels adjacent to each other in the vertical direction and having the same luminescent color is represented by k, a high resolution of display is achieved as in the case of an image display panel on which sub-pixels having the three primary colors are arrayed in a delta array in the case where the ratio k/r is 1/2. In general, when one pixel is formed of n sub-pixels, a high resolution of display is achieved as in the case of the image display panel on which sub-pixels having the three primary colors are arrayed in a delta array in the case where the ratio k/r is 1/2 as in the case of the foregoing.

When the value for the slope of the array formed of sub-pixels having the three primary colors is not 1/2 but 1/3, the positions of the centers of gravity of the sub-pixels 105 each having a shape of parallelogram are identical to the positions of the centers of gravity of rectangular sub-pixels arrayed in a scramble array. That is, an image display panel having an array in which the value for the slope is 1/3 can be replaced with an image display panel having rectangular sub-pixels arrayed in a scramble array. Even when a substrate on which an active matrix circuit is formed is used as the substrate, an active matrix circuit having the same design as that for rectangular sub-pixels arrayed in a scramble array can be used.

When the value for the slope is neither 1/2 nor 1/3, the positions of the centers of gravity of the sub-pixels 105 each having a shape of parallelogram do not correspond to the conventional delta array or scramble array of rectangular sub-pixels. However, a two-dimensional, regular color pixel array is established, so a value for a driving current to be applied to each sub-pixel for displaying a predetermined two-dimensional color image can be surely determined, and a desired image can be displayed. When the slope is small, there is no difference between the present invention and a conventional vertical stripe, so the advantage of the present invention, that is, an improvement in resolution upon display of a natural image becomes small.

On the other hand, when the slope of the sub-pixels each having a shape of parallelogram is large, each sub-pixel narrows, so an occupied area ratio of the sub-pixel to a non-pixel portion reduces, and detrimental effects such as a reduction in brightness of the image display panel, an increase in current density of a device, and the shortening of the driving lifetime of the device cannot be ignored.

Therefore, a range of the value for the slope of 1/5 to 1/1 is effective in practical use, though the suitable range of the value is not limited on principle. A value for the slope of 1/3 or 1/2 is particularly effective because the design of a conventional delta array or scramble array can be utilized.

Only the sub-pixels 105 having the same luminescent color are arrayed in a linear fashion in the image display panel having the shapes and array of the sub-pixels 105 shown in FIG. 1. In short, the sub-pixels 105 having the same luminescent color are arrayed in a stripe fashion so that the first straight line s connecting the positions of the centers of gravity of the sub-pixels 105 adjacent to each other in the vertical direction is parallel to the two parallel sides of each of the sub-pixels 105. Stripes each obtained by arraying the organic EL devices are arranged so as not to overlap each other and so as to be parallel to each other while being slanted with respect to the vertical line v. As a result, the mask 201 having the stripe-shaped through-holes 202 as schematically exemplified in FIGS. 2A, 2B and 2C can be used in the step of depositing a material for each sub-pixel 105 through a mask onto the substrate.

Figure 2A:
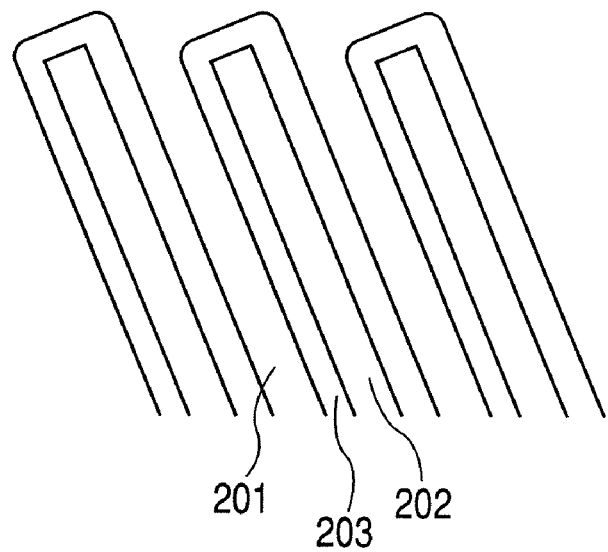
FIGS. 2A, 2B, and 2C are each a plan view illustrating an example of a mask to be used in the production of the image display panel of the present invention.

FIG. 2A is an explanatory view for a stripe-shaped through-hole portion. Since an interval between the adjacent stripe-shaped through-holes 202 formed in the mask 201 is twice as long as the pitch at which the sub-pixels are arrayed, the shaved portions 203 of the adjacent through-holes can be produced so as not to interfere with each other.

Figure 2B:
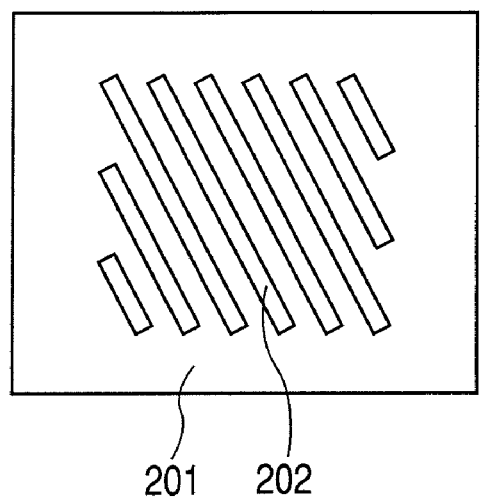
Figure 2C:
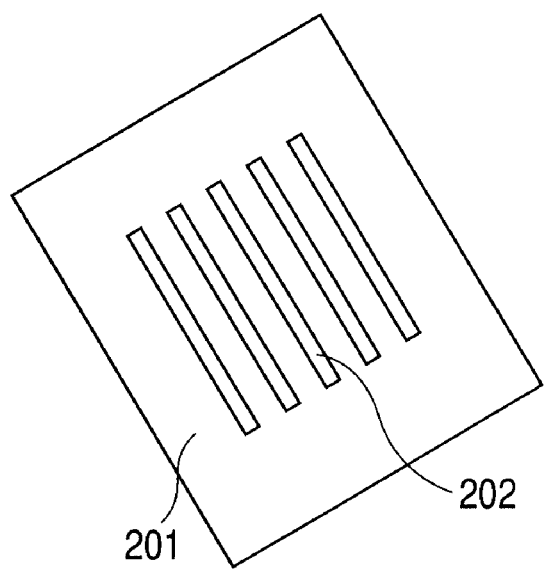

Although the through-holes 202 may be formed obliquely to the mask 201 as schematically shown in FIG. 2B, the following procedure may be adopted: the through-holes are formed so as to be parallel to each other along the entire shape of the mask 201 as shown in FIG. 2C, and the mask 201 is obliquely rotated in its plane before use. Such processing as shown in FIG. 2C is convenient for an improvement in ease with which a tension is uniformly applied in a stripe direction because the mask 201 is often fixed to a jig before use by applying a predetermined tension. In that case, a second mask having an opening corresponding to the shape of an image display region on the substrate may be overlapped in order that the deposition of a material on a region except the image display region may be prevented.

A method including placing a magnet on the back surface of the substrate to localize the mask formed of a magnetic material at a predetermined position with a magnetic force may also be employed.

When the mask 201 shown in any one of FIGS. 2A to 2C is used, a vacuum deposition material is deposited as the organic compound layer across the multiple adjacent sub-pixels 105 in accordance with the shape of each of the through-holes 202. However, the second electrode is also similarly formed across the adjacent sub-pixels 105 so as to be a common electrode in ordinary cases, a cross-talk current between devices is of no particular concern even when the organic compound layer is not cut between the adjacent sub-pixels 105.

In addition, the shape of each sub-pixel 105 is determined by not the shape of a region where the organic layer is deposited but the shapes of the first electrode on the substrate, and, typically, a device isolation film formed on the circumferential portion of the first electrode. From the viewpoint as well, whether a stripe-shaped deposited layer is placed across adjacent sub-pixels is of no concern.

Figure 3A:
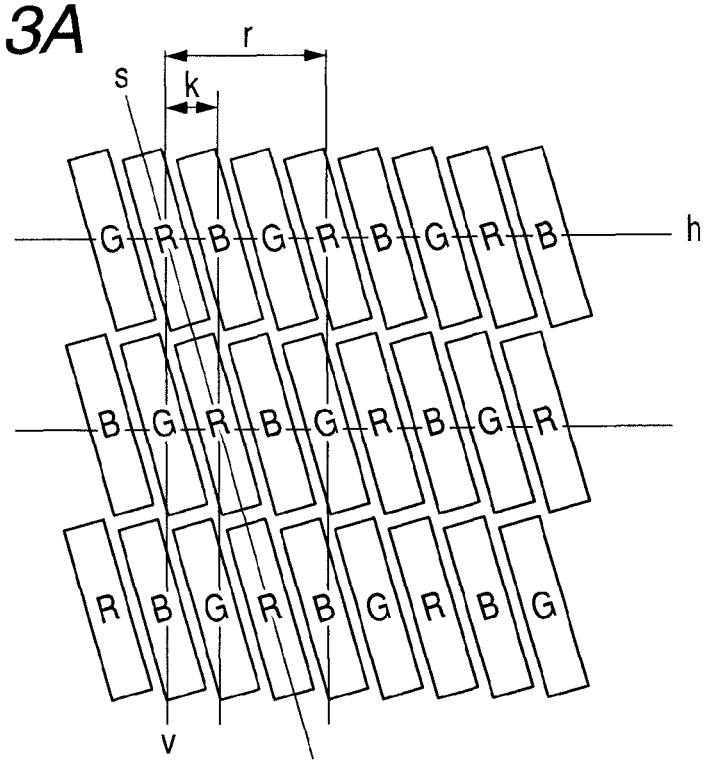
FIGS. 3A and 3B are each a plan view illustrating other examples of the shape and array of the sub-pixels of the image display panel of the present invention.
Figure 3B:
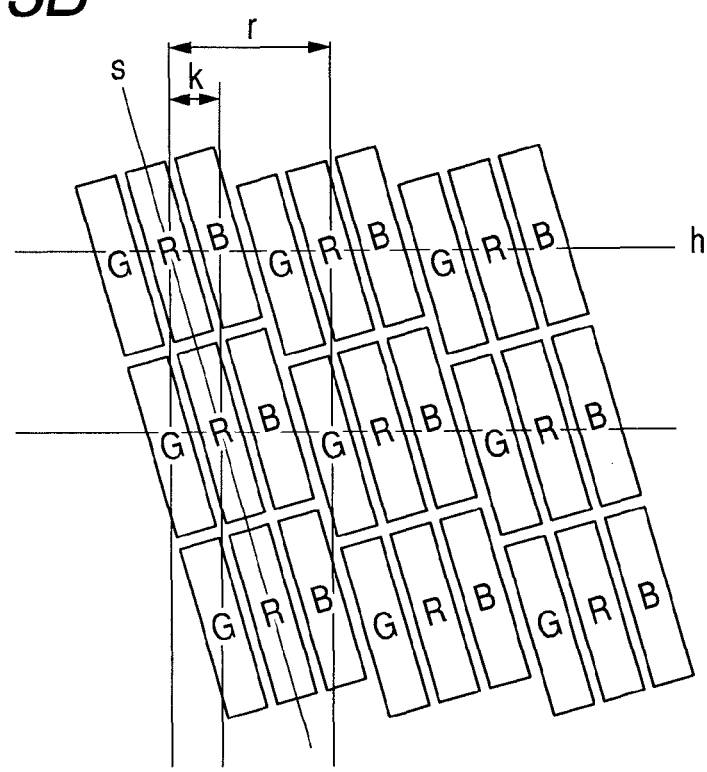

FIGS. 3A and 3B are each a schematic plan view illustrating other examples of the shape and array of the sub-pixels of the image display panel of the present invention. The figures each show a state where devices forming rectangular sub-pixels are slantingly arrayed.

In FIG. 3A as well, as in the case of FIG. 1, only the sub-pixels 105 having the same luminescent color are arrayed in a linear fashion. The magnitude of the slope determined in the same manner as in FIG. 1 has the following value: a value for the ratio k/r of the deviation amount k in the horizontal direction between the positions of the centers of gravity of the sub-pixels adjacent to each other in the vertical direction to the repetition pitch r of the sub-pixels adjacent to each other in the horizontal direction and having the same luminescent color is 1/3. Therefore, the positions of the centers of gravity of the respective sub-pixels are identical to the positions of the centers of gravity of rectangular sub-pixels arrayed in a scramble array schematically exemplified in FIG. 13A. The image display panel can display a color image comparable to that of a conventional image display panel having rectangular sub-pixels arrayed in a scramble array by supplying driving data comparable to that of the conventional panel at a driving timing comparable to that of the conventional panel.

FIG. 3B shows an example in which the center of gravity of a rectangular sub-pixel is slightly moved so that each pixel formed of sub-pixels is of a square form. In this example as well, as in the case of FIG. 3A, a value for k/r representing the slope is 1/3.

Figure 4A:
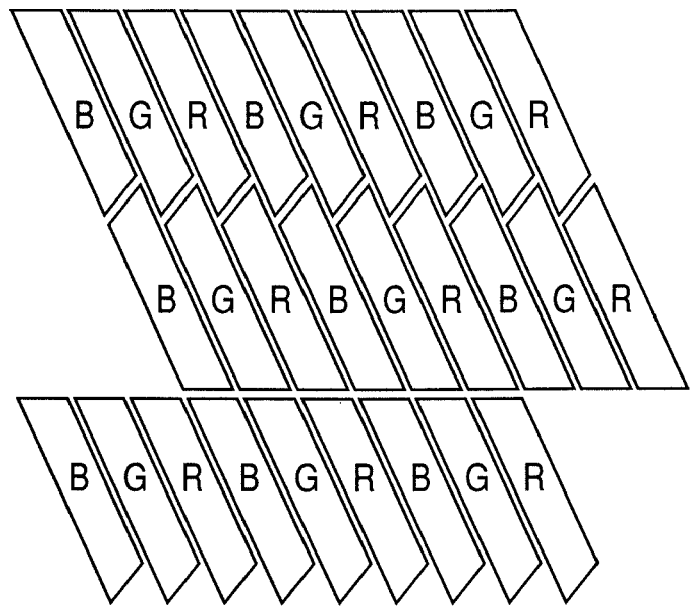
FIGS. 4A and 4B are each a plan view illustrating other examples of the shapes and array of the sub-pixels of the image display panel of the present invention.
Figure 4B:
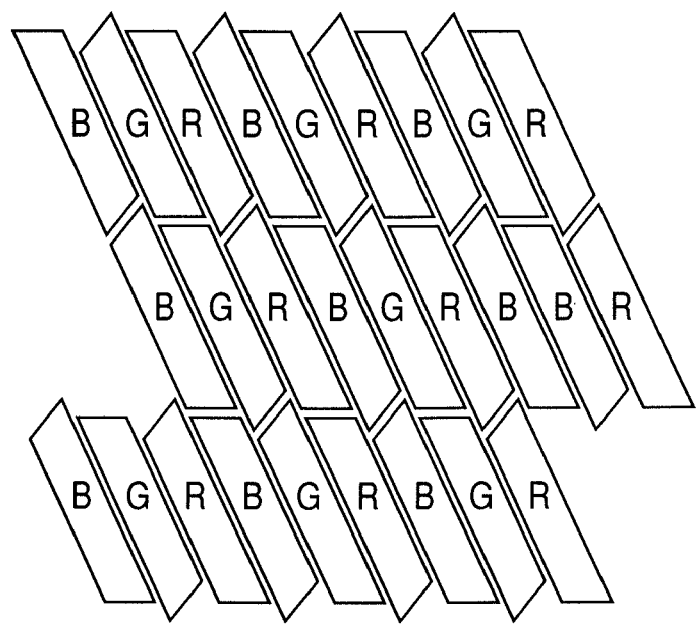

FIGS. 4A and 4B are each a schematic plan view illustrating other examples of the shapes and array of the sub-pixels of the image display panel of the present invention. The figures each show a state where devices forming sub-pixels each having another shape are slantingly arrayed.

FIGS. 4A and 4B each show an example in which a trapezoidal device is used in a sub-pixel. In each example, only sub-pixels having the same luminescent color are arrayed in a linear fashion, and the ratio k/r representing a value for the slope is 1/2.

Figure 5:
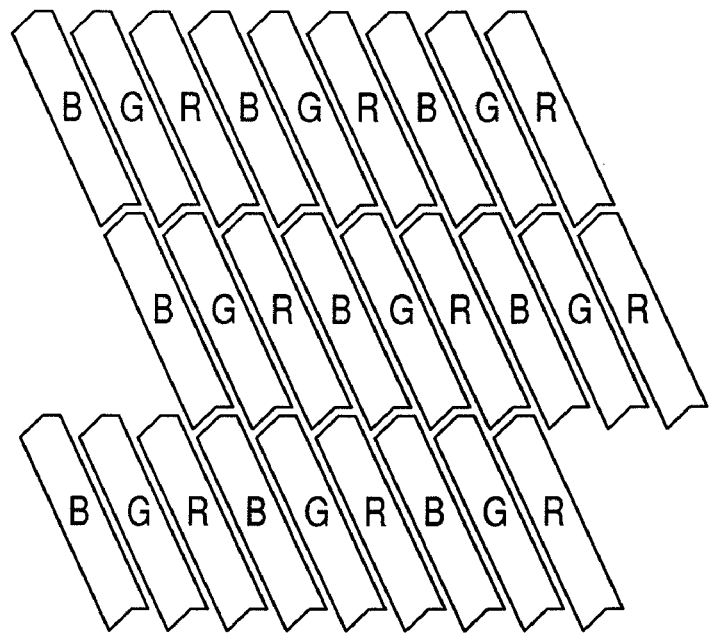
FIG. 5 is a plan view illustrating other examples of the shape and array of the sub-pixels of the image display panel of the present invention.

FIG. 5 is a schematic plan view illustrating an example of the image display panel of the present invention with sub-pixels each having a polygonal shape. In FIG. 5 as well, only sub-pixels having the same luminescent color are arrayed in a linear fashion, and the ratio k/r representing a value for the slope is 1/2.

Figure 6:
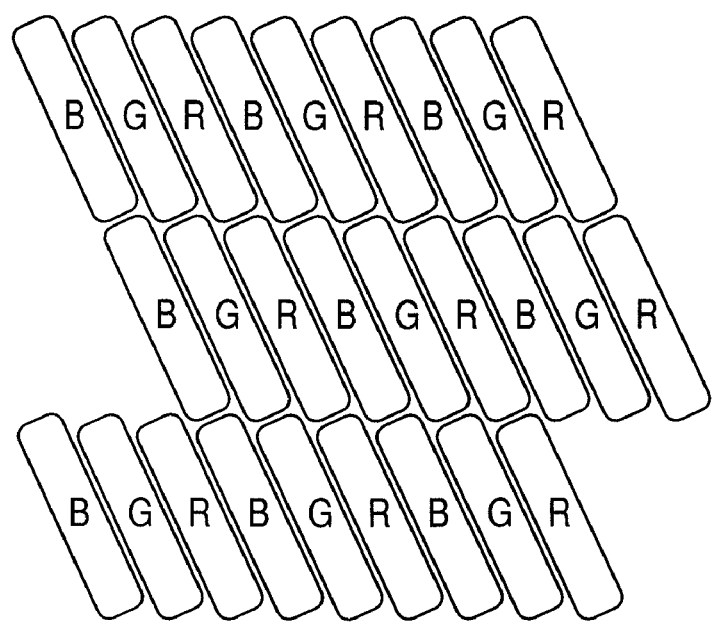
FIG. 6 is a plan view illustrating other examples of the shape and array of the sub-pixels of the image display panel of the present invention.

FIG. 6 is a schematic plan view illustrating an example of the image display panel of the present invention with sub-pixels each having such a shape that an apex portion of a rectangle is curved. In FIG. 6 as well, only sub-pixels having the same luminescent color are arrayed in a linear fashion, and the ratio k/r representing a value for the slope is 1/2.

Figure 7:
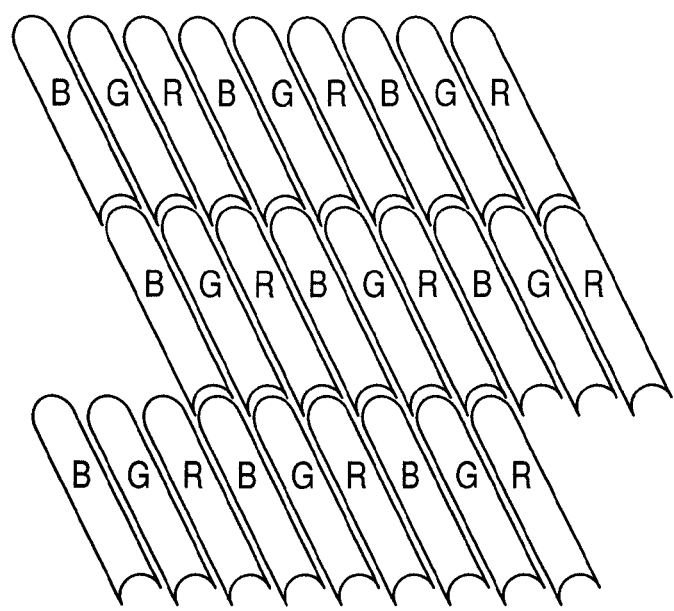
FIG. 7 is a plan view illustrating other examples of the shape and array of the sub-pixels of the image display panel of the present invention.

FIG. 7 is a schematic plan view illustrating an example of the image display panel of the present invention with sub-pixels each having a contour shape including curves. A sub-pixel in this example is of a shape surrounded by two parallel lines and the curves. In FIG. 7 as well, only sub-pixels having the same luminescent color are arrayed in a linear fashion, and the ratio k/r representing a value for the slope is 1/2.

A method of producing the image display panel of the present invention includes the step of forming the multiple first electrodes two-dimensionally arrayed on the substrate. In addition, the method includes the step of depositing organic light emitting materials having at least red, green, and blue luminescent colors at the positions where the first electrodes are formed through multiple through-holes of a mask having the through-holes for each luminescent color. Further, the method includes the step of forming the second electrode.

In short, the method is substantially similar to a method of producing an ordinary organic electroluminescence type two-dimensional color image display panel. However, in the step of forming the multiple first electrodes, the first electrodes each having a planar shape with a pair of two parallel sides are one-dimensionally placed so that a first side of the two parallel sides of each electrode is aligned with a straight line, and a second side of the two parallel sides of the electrode is also aligned with a straight line. The electrodes are two-dimensionally arranged so that the one-dimensional arrays of the electrodes are of shape of stripes arranged so as to be parallel to each other while being slanted with respect to the vertical line.

Then, in the step of depositing the organic light emitting materials, the mask in which the through-holes are formed into the shape of stripes so as to correspond to stripes obtained by forming the first electrodes is aligned so that the stripes obtained by forming the first electrodes and the through-holes of the mask are opposed to each other. After that, the organic light emitting materials are deposited through the through-holes of the mask.

To be specific, the vacuum deposition step for the materials with the mask is performed during at least the formation of a light emitting layer.

The mask 201 exemplified in each of FIGS. 2A to 2C is brought close to the substrate so that the shaved portions 203 of the mask are on a material emitter side, and is aligned so that each stripe-shaped through-hole 202 overlaps the array of sub-pixels having a predetermined color on the substrate. Only a predetermined amount of a predetermined material is deposited from a material emitter under a reduced pressure of about $10^{-4}$ Pa, and the material is formed into a film on the array of the sub-pixels on the substrate opposed to the position of the through-hole 202. When a mixed layer formed of multiple kinds of materials is deposited, the film formation is performed by preparing different material sources the number of which is equal to the number of the kinds of the materials.

Next, when another material is deposited onto a sub-pixel having another luminescent color, the mask 201 is shifted by a pitch of one sub-pixel in its surface direction, and is aligned so that each of the through-holes 202 is opposed to the array of sub-pixels having the other color. Then, the other material is formed into a film on the array of the sub-pixels having the other luminescent color in the same manner as that described above. Film formation for the sub-pixels having the respective colors is performed by repeating the foregoing operation. Alternatively, the dedicated masks 201 each exemplified in each of FIGS. 2A to 2C may be separately prepared for the respective steps of depositing the materials for the sub-pixels having different luminescent colors. In this case, each of the other masks 201 is aligned with the substrate every time another material is deposited onto a sub-pixel having another luminescent color, and each material is deposited onto the substrate through each through-hole 202 from a material emitter so as to be formed into a film.

When the composition, kind, and deposition amount of the material of a layer except a light emitting layer for a sub-pixel having another luminescent color must be changed in accordance with the color of the sub-pixel, a step involving the use of the mask 201 exemplified in each of FIGS. 2A to 2C can be utilized as in the case of the foregoing.

For example, when an image display panel having a light interference structure in the layer direction of each device to be described later is produced, the thickness of each layer except a light emitting layer must be set to a predetermined thickness in accordance with a luminous wavelength. In addition, a material for, for example, an electron transporting layer or hole transporting layer which transfers charge to a light emitting layer is changed in accordance with a material for the light emitting layer in some cases because the material for an electron transporting layer or hole transporting layer must be selected so that its LUMO or HOMO level establishes an appropriate relationship with each level of the light emitting layer. Therefore, in such case as well, a material is selectively deposited at a predetermined position with the mask 201 through each through-hole 202.

It should be noted that, in an image display panel having the shapes and array of sub-pixels exemplified in any one of FIGS. 3A to 7, each sub-pixel has two parallel sides as in the case of FIG. 1, and sub-pixels having the same luminescent color are arrayed in a linear fashion in the direction of the two sides. Therefore, the above-mentioned vacuum deposition step with the mask 201 having the through-holes 202 exemplified in each of FIGS. 2A to 2C can be utilized in the production of any image display panel.

Next, an example of the layer constitution of such image display panel having the shapes and array of sub-pixels as described above will be described. It should be noted that the present invention is not limited by, for example, a layer constitution, a component, and the thickness of each layer.

Figure 8A:
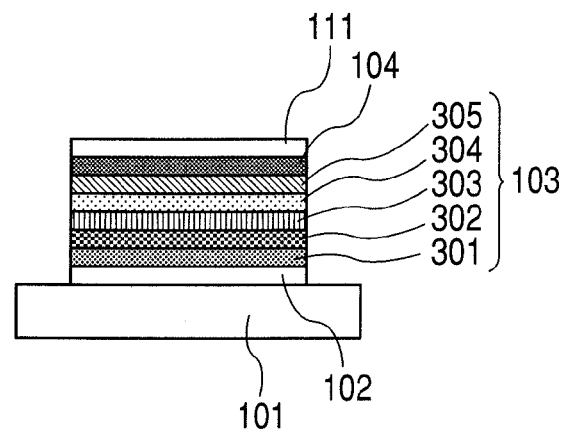
FIGS. 8A and 8B are each a schematic view illustrating an example of the layer constitution of each sub-pixel of the image display panel of the present invention.
Figure 8B:
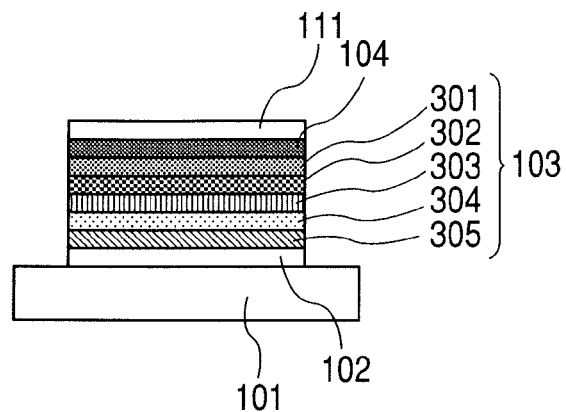
Figure 12:
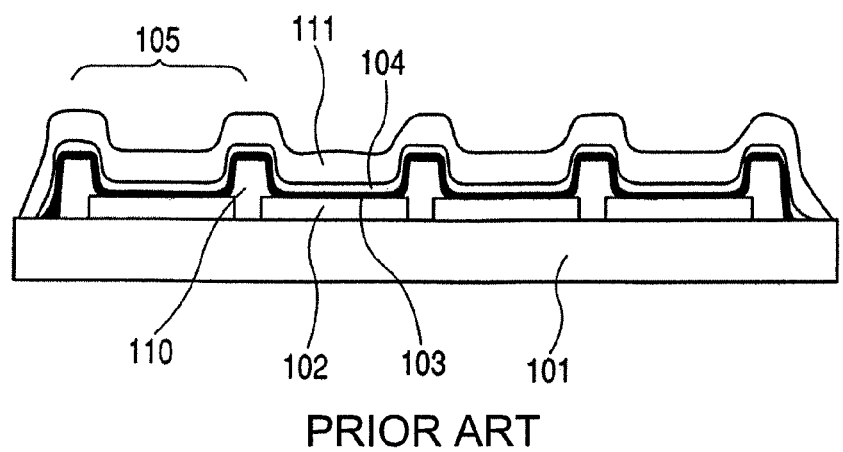
FIG. 12 is a sectional view illustrating an example of an image display panel in which a device isolation film is formed around a device.

FIGS. 8A and 8B are each a sectional view for describing an example of the layer constitution of each organic EL device. FIG. 8A is schematic view for such a type that an anode is placed on a substrate side, so the first electrode serves as the anode, and the second electrode serves as a cathode. FIG. 8B is a schematic view for such a type that a cathode is placed on a substrate side, so the first electrode serves as the cathode, and the second electrode serves as an anode. In each of the figures, reference numeral 101 represents the substrate, 102 represents the first electrode, 301 represents a hole injecting layer, 302 represents a hole transporting layer, 303 represents a light emitting layer, 304 represents an electron transporting layer, 305 represents an electron injecting layer, 104 represents the second electrode, and 111 represents the protective layer. Each of the layers 301 to 305 represents the same layer as that collectively shown as the organic compound layer 103 in each of FIGS. 11A, 11B, 11C and 12. Because FIGS. 8A and 8B are each a view for describing a portion where the light emission of the device occurs, the device isolation film 110 shown in FIG. 12 is not shown in each of FIGS. 8A and 8B. In addition, when an active matrix circuit is used for driving each device, a driver transistor, a portion to be connected to the first electrode, and the like are formed on the surface of the substrate 101, but these elements are not shown in each of the figures either.

The substrate 101 is used for mechanically holding, for example, each device of the image display panel of the present invention on its surface, and glass, a ceramic such as quartz or alumina, or a plastic such as polyethylene naphthalate, polyether ether ketone, polyamideimide, or polyimide is used in the substrate. In addition, for example, a composite material made of a plastic, glass, or the like containing, in itself, a fibrous or powdery filler made of a metal such as nickel steel, stainless steel, aluminum, or titanium, or a ceramic or a metal is used in the substrate. It should be noted that an insulating layer is formed on the surface of the substrate 101 before the substrate is used when the substrate is conductive because the multiple first electrodes 102 must be formed on the surface, and must be independently driven.

A thickness needed for the substrate 101 is determined from: a strength needed for handling at the time of the production of the image display panel; and the needed strength of the completed image display panel. The thickness cannot be uniquely determined because the thickness is related also to the breadth of the image display panel, but a thickness of about 0.3 mm to 2 mm is appropriate for the case where the substrate is made of a brittle material such as glass or a ceramic, or a thickness of about 0.1 mm to 2 mm is appropriate for the case where the substrate is made of a material resistant to deformation, such as a plastic or a metal.

For example, a metal such as aluminum, chromium, nickel, or silver or an alloy of any one of these metals, or a conductive oxide such as tin oxide, an indium tin oxide, an indium zinc oxide, or a zinc oxide is used as a material for the first electrode 102. The metal or conductive oxide may be used alone, or two or more layers each formed of any such metal or conductive oxide may be overlapped before use.

The individual planar shapes and array of the first electrodes 102 have been described above, a patterning method for forming the shapes and the array to be employed has only to be selected from conventionally known technologies such as a wet or dry etching technology, a selective deposition technology involving the use of a mask, and an ink-jet technology.

A thickness needed for each of the first electrodes 102 is selected so that a potential distribution in each electrode becomes sufficiently small, and depends on, for example, a current at the time of the driving of a device, the conductivity of a material for each electrode, and a method of supplying a current to each electrode; in ordinary cases, a thickness of several tens of nanometers or more is selected when each electrode is formed of a metal material, and a thickness of several hundreds of nanometers or more is selected when each electrode is formed of a conductive oxide material. Of course, in the case of a composite electrode using a metal material having a sufficient thickness as its ground and a conductive oxide material as its surface, no problem arises even when the thickness of the conductive oxide material is 100 nm or less.

A material for the device isolation film is selected from insulating materials including: plastics such as an acrylic resin and a polyimide resin; and ceramics such as silicon oxide, silicon nitride, and aluminum oxide. When a plastic is used, it is particularly convenient to perform patterning with a material known as a photoresist material. When a ceramic is used, desired patterning is performed by a selective deposition technology involving the use of a mask or an etching technology involving the use of a resist material.

The device isolation film is formed to surround the circumferential portion of each of the above first electrodes 102. The device isolation film has a role of preventing a mask from directly contacting with a device portion to damage a deposited film at the time of a vacuum deposition step involving the use of the mask to be performed later. In addition, the device isolation film has a role of preventing a short circuit due to a defect between the second electrode 104 to be formed later and each of the first electrodes 102. Further, the device isolation film has a role of, for example, preventing a short circuit by covering a step portion at an end of each of the first electrode 102. The thickness of such device isolation film to be frequently used ranges from 200 nm to 4 µm.

The hole injecting layer 301 has the following role: the layer extracts a hole from an electrode (anode) in contact with the layer, and transfers the hole to the hole transporting layer 302 to be described later. A material for the layer is, for example, a transition metal oxide such as molybdenum oxide, tungsten oxide, or vanadium oxide, or a transition metal complex such as copper phthalocyanine. It should be noted that the hole injecting layer 301 may be omitted in the case where a hole can be directly injected into the hole transporting layer 302 to be described later such as the case where the anode material is formed of a metal oxide such as an indium tin oxide or an indium zinc oxide.

When a device having a constitution shown in FIG. 8B is produced, providing the hole injecting layer 301 is expected to exert a reducing effect on damage to the organic compound layer below the hole injecting layer 301 in the step of depositing the second electrode 104.

The thickness of the hole injecting layer 301 to be typically used is about 2 nm to 100 nm. The hole injecting layer 301 may be formed by selectively depositing any one of the above materials onto a portion where a device is formed in a mask vacuum deposition step or the like, or may be non-selectively formed on the substrate 101.

The hole transporting layer 302 has a role of transferring the injected hole to the light emitting layer 303 to be described later. A hole transporting material forming the hole transporting layer preferably has mobility which facilitates the injection of a hole, and is excellent in transportation of the injected hole to the light emitting layer 303. The material may have low electron transporting performance. Examples of the low-molecular weight-based material having hole injecting or transporting performance include, but of course not limited to, triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, and porphyrin derivatives. Hereinafter, a part of specific examples of the materials is shown.

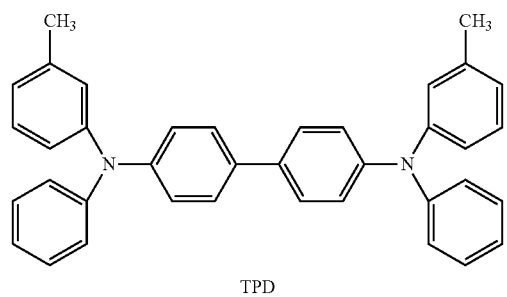

TPD

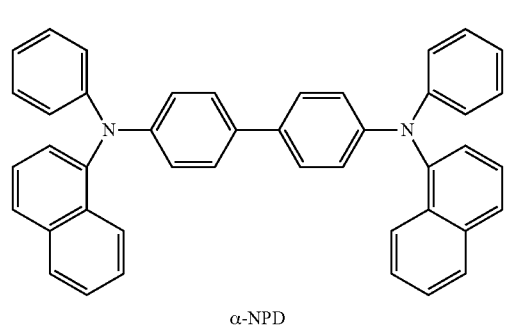

α-NPD

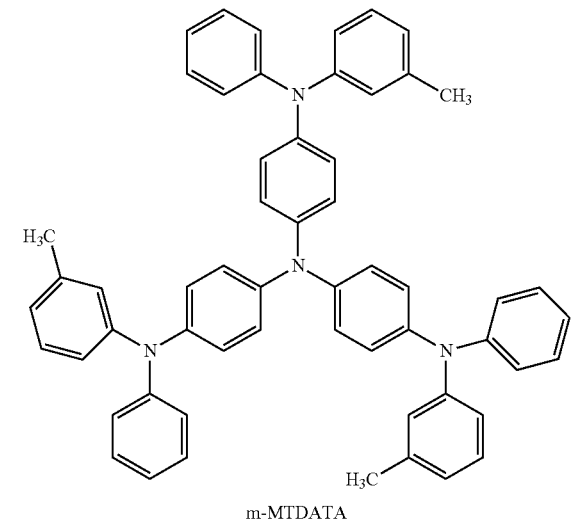

m-MTDATA

-continued

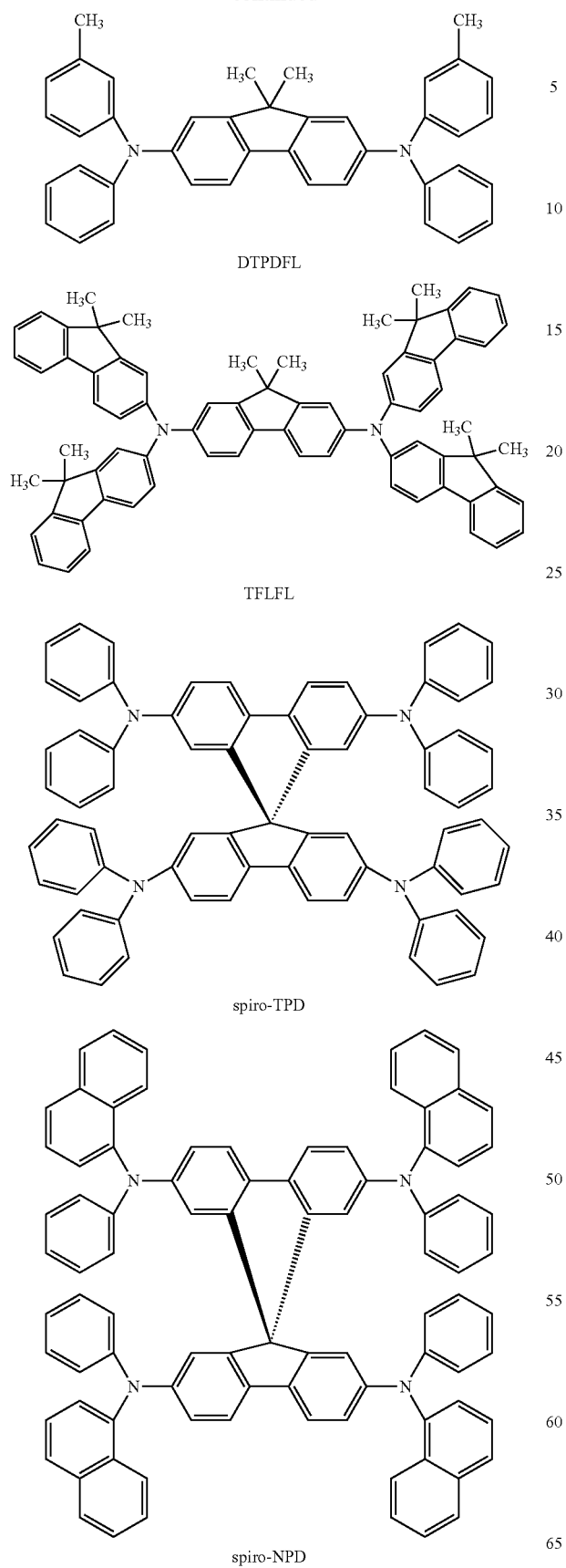

DTPDFL

TFLFL spiro-TPD spiro-NPD

-continued

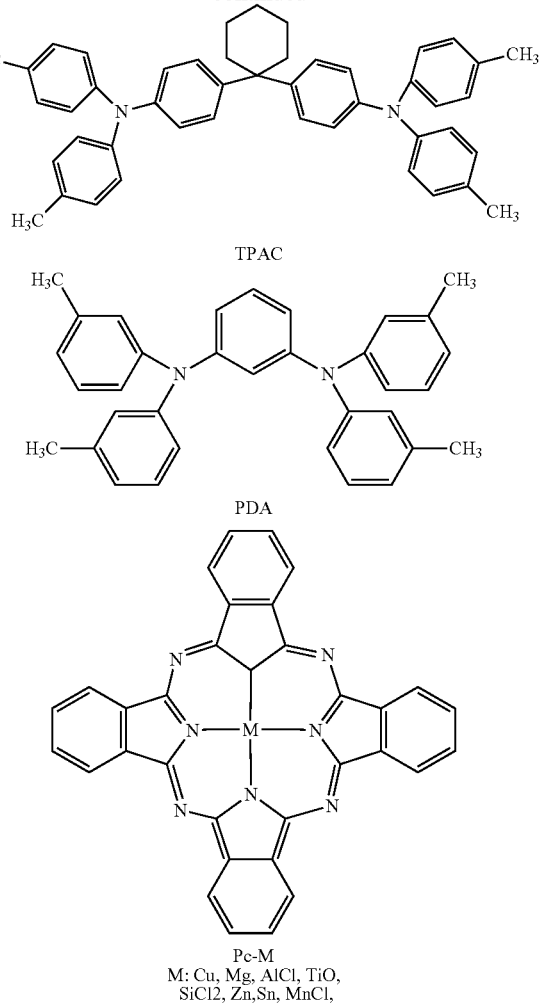

TPAC

PDA

Pc-M
M: Cu, Mg, AlCl, TiO,
SiCl2, Zn,Sn, MnCl,
GaCl, etc

A polymer hole transporting material is also known, and poly(vinyl carbazole), poly(silylene), poly(thiophene), or any other conductive polymer can be utilized.

A single hole transporting material may be used, or the hole transporting layer 302 may be formed by mixing multiple materials.

The hole transporting layer 302 may be formed by selectively depositing any one of the above hole transporting materials onto a portion where a device is formed in, for example, a vacuum deposition step involving the use of a mask, or may be non-selectively formed on the substrate 101. In ordinary cases, the following procedure is adopted: a polymer material is dissolved in a solvent so that an appropriate solution is prepared, the solution is formed into a film by a rotary application method or the like, and the solvent is removed by drying. The thickness of the hole transporting layer 302 is set to 5 nm to 200 nm.

The light emitting layer 303 has the following role: a hole is injected from the hole transporting layer 302 into the light emitting layer, an electron is injected from the electron transporting layer 304 to be described later into the light emitting layer, and the light emitting layer emits light by virtue of an excited state caused upon offset of both the hole and the electron in the layer. A fluorescent material or phosphorescent material having high light emitting efficiency is used as a light emitting material. The light emitting layer is sometimes formed by using the light emitting material alone, but the light emitting layer is often formed by mixing the light emitting material and a carrier transporting material with a view to achieving, for example, the following effect: the concentration of excited molecules is lowered so that the frequency at which the layer is deactivated so as to be unable to emit light is reduced. An electron transporting material to be described later or a bipolar transporting material having an appropriate mobility for each of both a hole and an electron as well as any one of the above-mentioned hole transporting materials can be utilized as the carrier transporting material. Even some materials each having light emitting property alone can each be utilized as a carrier transporting material by being mixed with a light emitting material having lower excitation energy than that of the material because the light emission of the material itself is suppressed. The thickness of the light emitting layer 303 is about 5 nm to 200 nm.

Part of specific examples of the light emitting material are shown. The present invention is not limited to these examples.

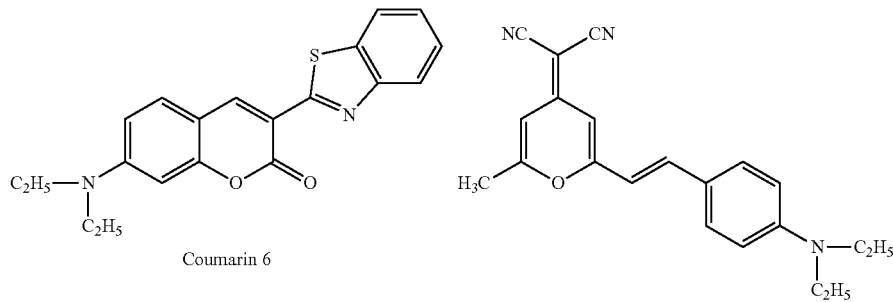

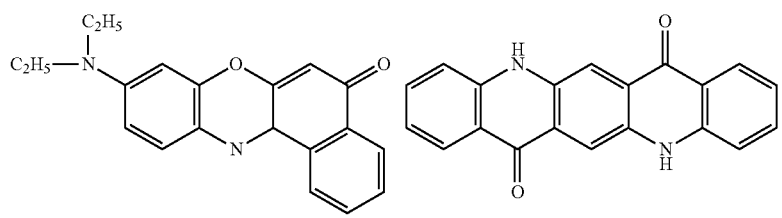

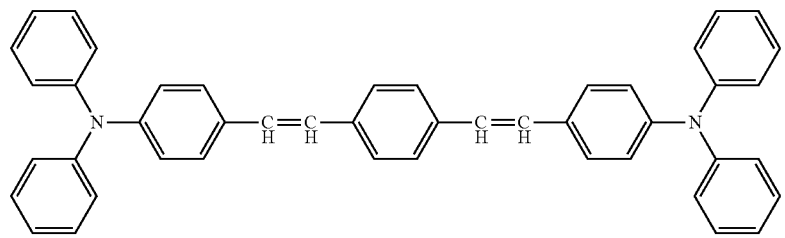

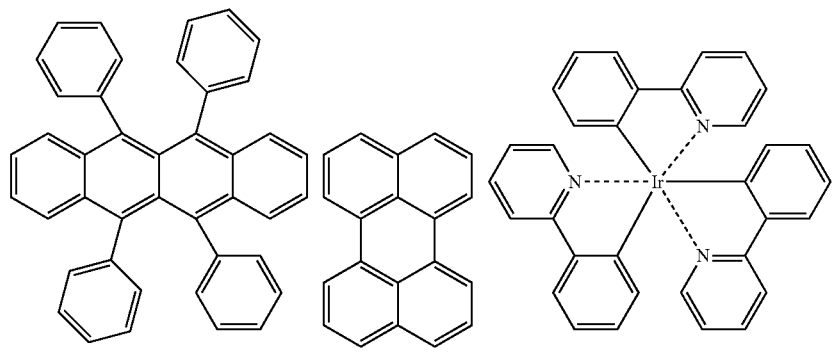

Bipolar Transportable Light Emitting Material

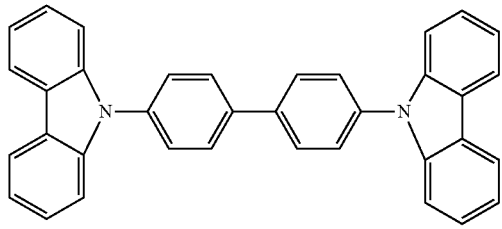

CBP

The electron transporting layer 304 has a role of transferring an electron injected from the electron injecting layer 305 to be described later to the light emitting layer 303. An electron transporting material can be arbitrarily selected from those each having a function of transporting an injected electron, and is selected in consideration of, for example, a balance with the carrier mobility of a hole transporting material. Examples of a material having electron injecting or transporting performance include, but of course not limited to, oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, and organometallic complexes. Hereinafter, a part of specific examples of the materials is shown.

Electron Transportable Light Emitting Material

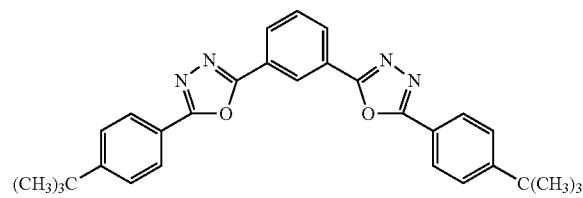

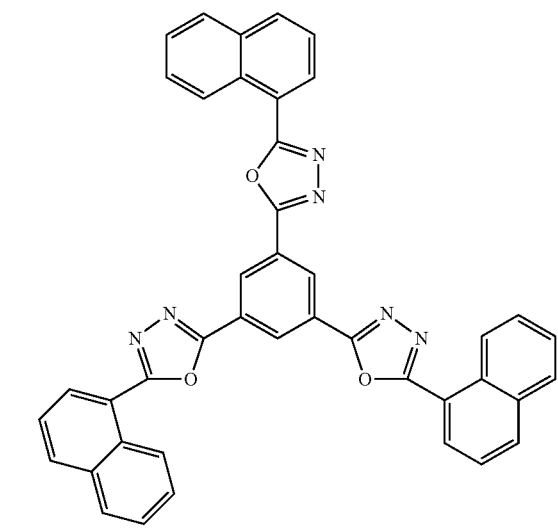

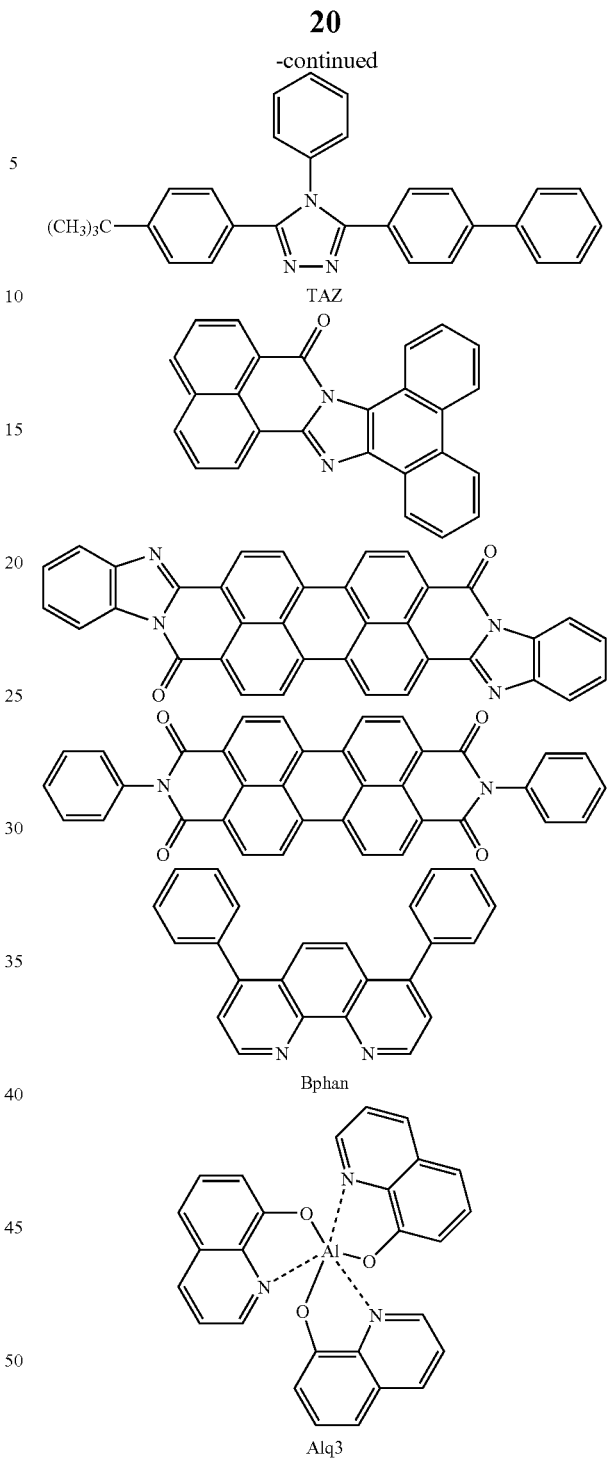

The electron transporting layer 304 may be formed by selectively depositing any one of the above electron transporting materials onto a portion where a device is formed in, for example, a vacuum deposition step involving the use of a mask, or may be non-selectively formed on the substrate 101. A single electron transporting material may be used, or the electron transporting layer may be formed by mixing multiple materials. The thickness of the electron transporting layer 304 ranges from 2 nm to 80 nm.

The electron injecting layer 305 has the following role: the layer extracts an electron from an electrode (cathode) in contact with the layer, and transfers the electron to the electron transporting layer 304. A usable electron injecting material is a material obtained by incorporating, into any one of the above-mentioned electron transportable materials, an alkali metal such as lithium or cesium, an alkaline earth metal such as magnesium or calcium, or a compound of the alkali metal or of the alkaline earth metal. For example, a material obtained by incorporating 0.1 percent to several tens of percent of, for example, cesium carbonate into an electron transportable material to impart electron injecting property can be used. Alternatively, an alkali metal salt such as lithium fluoride can be used in the electron injecting layer.

The electron injecting layer 305 is not an essential layer, but the following effect can be expected from the layer: the layer extracts an electron from an electrode in contact with the layer without causing a large potential drop at an interface between the layer and the electrode. In addition, when a device having a constitution shown in FIG. 8A is produced, the layer is expected to exert a reducing effect on damage to the organic compound layer below the electron transporting layer 304 in the step of depositing the second electrode 104. The thickness of the electron injecting layer 305 to be inserted is preferably about 2 nm to 100 nm in order that good electron injecting property, the reducing effect on the damage, and the like may be secured.

In some cases, the protective layer 111 is provided for preventing the produced device from contacting with, for example, oxygen or moisture. Examples of the protective layer 111 include: a metal nitride film made of silicon nitride, silicon nitride oxide, or the like; a metal oxide film made of tantalum oxide or the like; a diamond-like carbon (DLC) thin film; a polymer film made of a fluorine resin, polyparaxylene, polyethylene, a silicone resin, a polystyrene resin, or the like; and a photocurable resin.

Alternatively, unlike FIGS. 8A and 8B in each of which the protective layer 111 is provided so as to overlap the second electrode 104, the device can be protected by being covered with an impermeable cap. That is, a portion where the device is formed is covered with, for example, glass, a gas impermeable film, or a metal (not shown) under an inert atmosphere such as a nitrogen or argon atmosphere, or a reduced pressure atmosphere, and the entirety of a portion of the substrate 101 where a film is formed is packaged with an appropriate sealing material, whereby the device can be protected.

A moisture absorbent may be incorporated into, or placed in, the protective layer 111 or the package in order that the moisture resistance of the device may be improved.

When the substrate 101 and the first electrodes 102 are each translucent, the resultant image display panel is of a bottom emission constitution in which light generated by the light emitting layer 303 can be extracted from the side of the substrate 101. In this case, the substrate 101 and the first electrodes 102 should each have a transmittance of 50% or more with respect to the main wavelength of light generated by the light emitting layer 303.

In addition, when the surface of the substrate 101 has wiring or an active matrix circuit, an image display panel of the bottom emission constitution must be designed so that no such circuit inhibits the permeability of light toward the side of the substrate 101.

The brightness of an image to be displayed by the image display panel of the bottom emission constitution can be improved by increasing the quantity of light that can be extracted toward the side of the substrate 101 by providing a light reflecting surface on the side of the second electrode 104. A metal surface, an interface between transparent layers different from each other in refractive index, or the like can be used as the reflecting surface. For example, the reflecting surface can be formed by making the second electrode 104 from a metal or by laminating a transparent material and a metal to form the second electrode 104. Even when the second electrode 104 is made of a transparent material, the quantity of light that can be extracted toward the side of the substrate 101 can be increased by the lamination (not shown) of transparent materials different from each other in refractive index on the second electrode 104. The reflectance of the light reflecting surface should be 70% or more.

When the second electrode 104 and the protective layer 111 are each translucent, the resultant image display panel is of a top emission constitution in which light generated by the light emitting layer 303 can be extracted from the side opposite to the substrate 101. In this case, the second electrode 104 and the protective layer 111 should each have a transmittance of 50% or more with respect to the main wavelength of light generated by the light emitting layer 303. The brightness of an image to be displayed by the image display panel of the top emission constitution can be improved by increasing the quantity of light that can be extracted toward the side opposite to the substrate 101 by providing a light reflecting surface on the side of each of the first electrodes 102. As in the case of the above-mentioned bottom emission constitution, a metal surface, an interface between transparent layers different from each other in refractive index, or the like can be used as the reflecting surface. The reflectance of the light reflecting surface should be 70% or more with respect to the main wavelength of light generated by the light emitting layer 303.

When an optical distance between the reflecting surface and the light emitting layer is adjusted so that a condition under which light to be directly extracted from the light emitting layer 303 and light to be extracted after being reflected on the reflecting surface intensify each other is satisfied, light having a specific wavelength can be strongly extracted. In the case of a fixed-end reflecting surface such as a metal surface, the phase of light is shifted by about 180° as a result of reflection, so the above condition is satisfied when an optical distance between a position in the light emitting layer 303 at which light emission occurs and the reflecting surface is set to about n quarters (where n represents an odd number) of the wavelength of the light. In the case of an open-end reflecting surface such as an interface between a transparent body in contact with a material having a refractive index lower than that of the body and the material, the phase of light undergoes nearly no shift as a result of reflection, so the above condition is satisfied when an optical distance between the light emitting layer 303 and the reflecting surface is set to about n halves (where n represents a natural number) of the wavelength of the light. Further, a micro resonator structure for light having a specific wavelength can be formed by: forming a semi-permeable reflecting surface capable of reflecting part of light on a light extraction side as well; and adjusting an optical distance between the light emitting layer 303 and the semi-permeable reflecting surface in the same manner as that described above.

When such wavelength selection structure based on light interference as described above is used, the chroma of light emitted from each of the sub-pixels (red, green, and blue) of which an image display panel is formed is improved as long as light having a predetermined wavelength is intensified for each of the sub-pixels. As a result, the GAMUT of display extends, and a color reproduction range can be improved.

It should be noted that the magnitude of the phase shift at the reflecting surface depends actually on, for example, the physical properties and thickness of a material of which a reflecting interface is formed, and the main position in the light emitting layer 303 at which light emission occurs, a value for the refractive index of each deposited layer, and the like have some degree of uncertainties. Accordingly, it is recommended that an appropriate light interference structure be found by actually prototyping a device.

When the substrate 101, the first electrodes 102, the second electrode 104, and the protective layer 111 are each translucent (including the meaning of the term "semi-permeable"), a double-face image display panel in which light generated by the light emitting layer 303 can be extracted from both surfaces of the substrate is obtained.

The present invention can be carried out also for a multi-photon constitution or multi-stage laminated constitution in which multiple organic EL devices are laminated. A photonic crystal or the like may be combined with the image display panel of the present invention in order that desired optical characteristics may be obtained.

A conventionally known technology can be utilized for the surface of the image display panel of the present invention. For example, an antireflection layer or an antiglare layer may be provided on the surface in order that the visibility of the panel may be improved. Alternatively, a circularly polarizing plate or a color filter may be combined with the surface in order that the quantity of ambient light reflected on a metal electrode to be viewed may be reduced.

Figure 9:
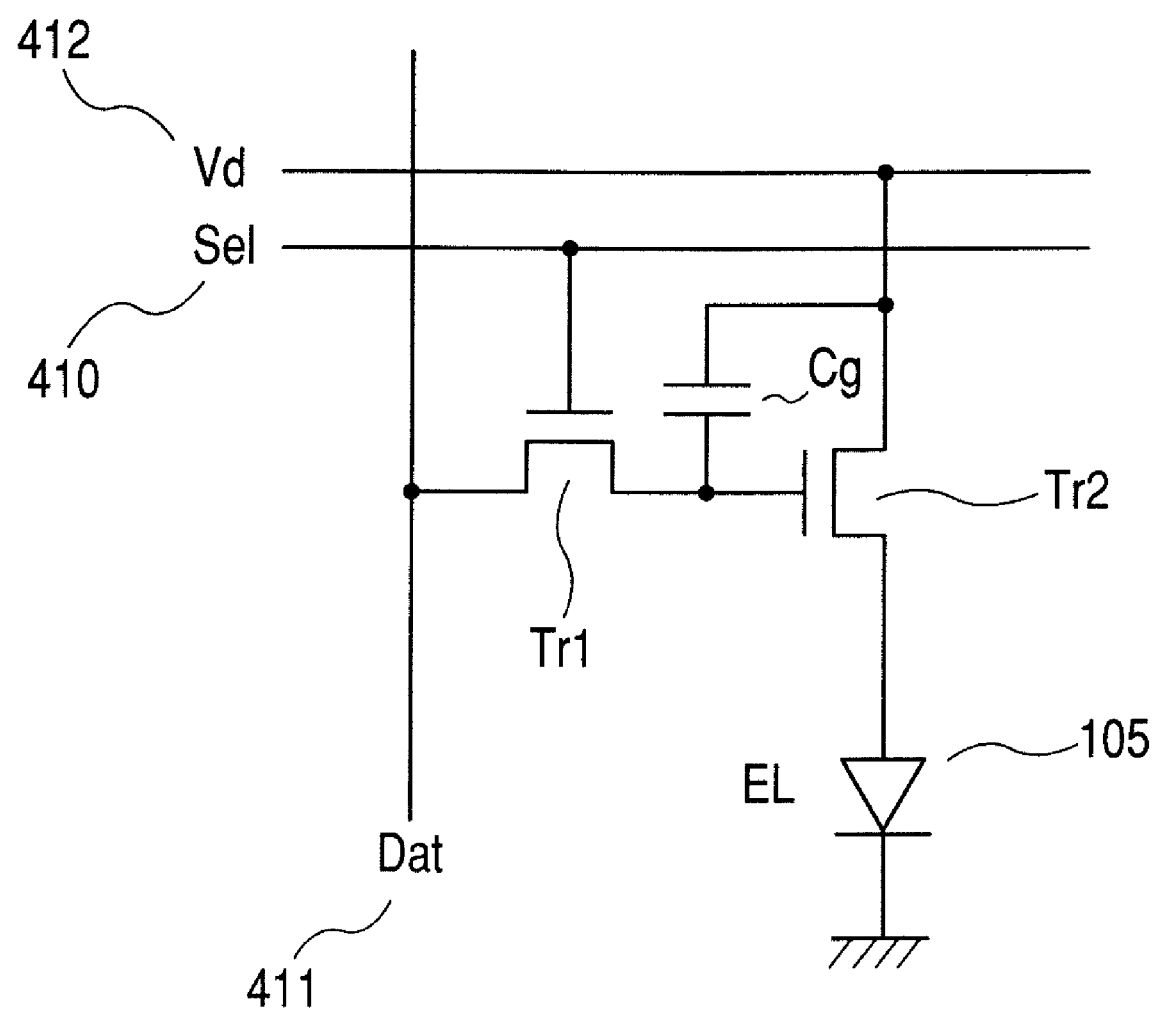
FIG. 9 is a circuit diagram illustrating an example of the control circuit of each sub-pixel of the image display panel of the present invention.

FIG. 9 is a view illustrating an example of the control circuit of each sub-pixel of the image display panel of the present invention. In the figure, reference numeral 105 represents a sub-pixel formed of the organic EL device. In this example, the second electrode is a common cathode, and the first electrodes are anodes to be individually driven by a transistor.

A transistor Tr1 is controlled by the potential of a selection signal line (scanning signal line) 410 to be applied to its gate, and is turned on at a predetermined timing to apply the potential of a data signal line 411 to the gate of a transistor Tr2. The transistor Tr2 flows a current determined by the applied potential of the gate from a power source line 412 to the sub-pixel 105 formed of an organic EL device. A capacitor Cg is connected to the gate of the transistor Tr2 so as to keep a potential difference across the transistor substantially constant while the transistor Tr1 is turned off, so the transistor Tr2 continues to flow a substantially constant current in accordance with the kept gate potential into the sub-pixel 105. The transistors Tr1 and Tr2, and the capacitor Cg are formed on the surface of the substrate near the sub-pixel 105.

Figure 10:
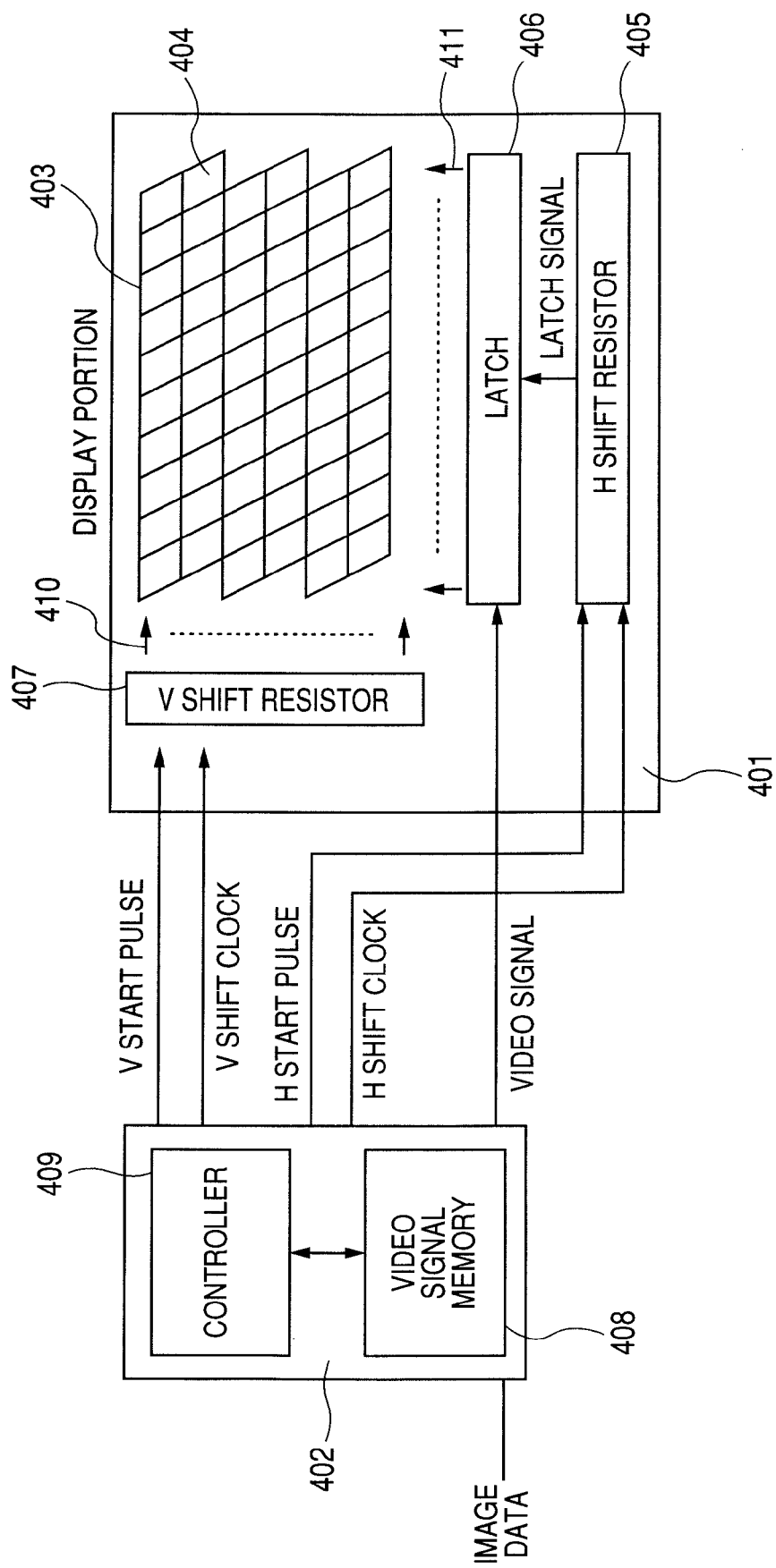
FIG. 10 is a block diagram illustrating an example of an image display apparatus of the present invention.
Figure 11A:
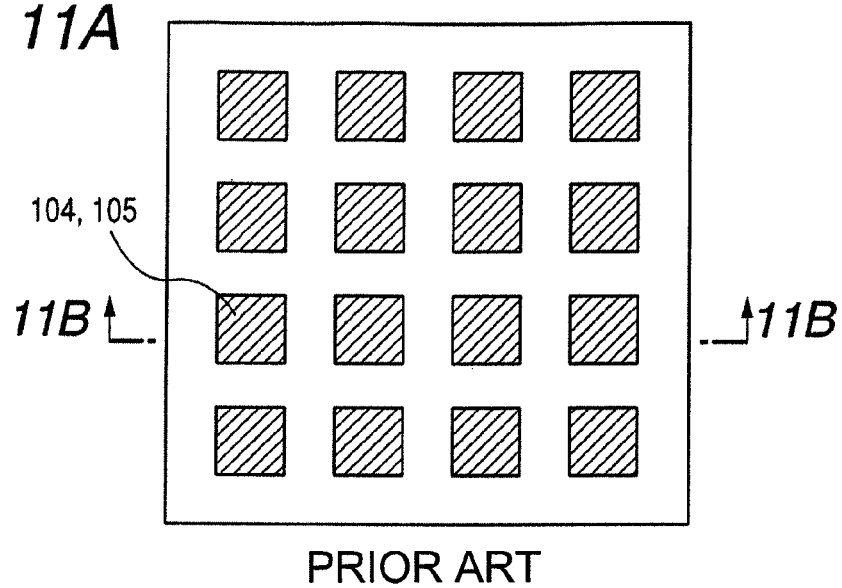
FIGS. 11A and 11B are each a schematic view illustrating an example of an image display panel on which organic EL devices are arrayed in a matrix fashion, FIG. 11A being a plan view illustrating the array of the respective pixels, and FIG. 11B being a sectional view taken along the line 11B-11B of FIG. 11A.
Figure 11B:
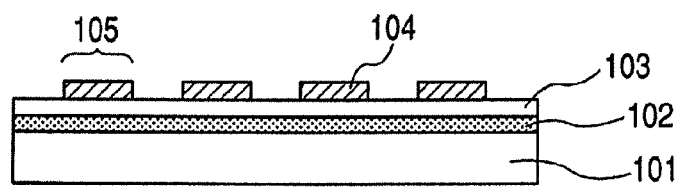

FIG. 10 is a functional block diagram illustrating an example of an image display apparatus of the present invention. The image display apparatus has the image display panel of the present invention and a display control portion. In the figure, reference numeral 401 represents the image display panel of the present invention, and reference numeral 402 represents the display control portion. A display portion 403 is formed on the surface of the image display panel 401. In the display portion, pixels 404 formed of sub-pixel arrays exemplified in FIG. 1 described above are arrayed, and a control circuit exemplified in FIG. 9 is formed in each sub-pixel. In addition, a latch array 406 in which elements to be described later are arranged is formed on the surface of the image display panel 401. The elements each capture an image data signal at a predetermined timing to maintain the potential of the data signal line 411 to the display portion 403. An H shift register 405 for giving each element of the latch array 406 the timing at which the element captures data is also formed on the surface. A V shift register 407 for sequentially selecting the selection (scanning) signal line 410 to the display portion 403 is also formed on the surface.

The display control portion 402 inputs image data to supply a video signal required by the image display panel 401 and a timing signal for each of the H shift register 405 and the V shift register 407.

The display control portion 402 has a video signal conversion memory 408 and a controller 409 for controlling a timing signal. The controller 409 serially outputs video signals from the video signal conversion memory to send the signals to the latch array 406.

The controller 409 generates an H start pulse that initializes the H shift register 405 and an H shift clock that shifts the H shift register 405 at the same time for generating a latch timing in a horizontal direction. The H shift register 405 uses the signals received from the controller 409 to generate latch signals for the latch array 406. The latch array 406 captures the video signals at the timings of the latch signals, and fixes an output potential to each data signal line 411 in accordance with a value for each signal.

In addition, the controller 409 generates a V start pulse that initializes the V shift register 407 and a V shift clock that shifts the V shift register 407 for generating a vertical direction selection timing. The V shift register 407 uses the signals from the controller 409 to give one of the scanning signal lines 410 a selection signal.

The devices arranged on the display portion 403 are each controlled by the control circuit exemplified in FIG. 9. The control circuit connected to the selected scanning signal line 410 stores the potential of the data signal line 411 in the capacitor Cg, and a current in accordance with the potential is supplied to an organic EL device of each of the pixels 404.

In FIG. 10, the drawn pixels 404 are each of a shape of parallelogram, and are arrayed so as to slant with respect to a vertical direction. However, there is no need for connecting each of the data signal lines 411 shown in FIG. 9 along the apparent oblique array. Sub-pixels adjacent to each other in the vertical direction may be connected to each other to provide the data signal line 411 shown in FIG. 10.

The image display panel of the present invention has the positions of the centers of gravity of sub-pixels comparable to those of the conventional delta array or scramble array of rectangular sub-pixels when the sub-pixels are arrayed so that a value for the slope is 1/2 or 1/3 as described above. Connection as described above allows image data represented in a conventional orthogonal coordinate system to be displayed as it is.

It should be noted that, when the placement of sub-pixels of which a pixel is formed is kept constant in the pixel, an offset between the center of gravity of each pixel and the center of gravity of a sub-pixel becomes constant. If the placement of sub-pixels in a pixel is not kept constant, the unevenness of the offset occurs in the screen of the image display panel, so unevenness resulting from the unevenness of the offset is viewed when, for example, monochromatic, smooth gradation is displayed. The above unevenness can be prevented by keeping the placement of the sub-pixels in the pixel constant.

At least two methods are available for connecting each of the data signal lines 411 in the case of the conventional delta array of rectangular sub-pixels. One of the methods involves: connecting each line to one of the two sub-pixels away from each other at the shortest distance in the vertical direction with neither discrimination between an odd row and an even row nor discrimination between the colors of sub-pixels; and drawing data lines the number of which is equal to the number of sub-pixels in the horizontal direction.

The other method involves: connecting sub-pixels having the same luminescent color along the shortest distance in the vertical direction for each of an odd row and an even row independently; and drawing data lines the number of which is twice as large as the number of the sub-pixels of each column adjacent to each other in the horizontal direction. The image display panel of the present invention may be based on each of the connecting methods.

Of course, in the image display panel of the present invention, driving information can be given to all pixels of the display portion 403 by the data signal lines 411 and the selection signal lines on principle even when each of the data signal lines 411 is connected obliquely along an apparent slant array. Therefore, even in the case of the oblique connection, desired image information represented in an orthogonal coordinate system can be displayed by performing the coordinate conversion of two-dimensional image information.

Hereinafter, the present invention will be described more specifically by way of examples. It should be noted that the present invention is not limited to these examples.

EXAMPLE 1

A method of producing the image display panel of the present invention will be specifically described. A silicon TFT active matrix drive circuit corresponding to 100 ppi is formed on a glass substrate. An insulating/planarizing layer made of an acrylic resin is superimposed on the circuit. A chromium reflecting layer having a thickness of 300 nm and an indium tin oxide layer having a thickness of 0.6 μm each connected to the driver transistor through a through-hole opened in the acrylic resin layer are formed. The chromium reflecting layer and the tin oxide layer are each patterned in the planar shape shown in FIG. 1, whereby a first electrode is obtained. The size of the first electrode, which is of a shape of parallelogram, is as follows: the length of a long side of the parallelogram is 237 μm, and the length of a short side of the parallelogram is 75 μm. An interval between the first electrodes adjacent to each other in a vertical direction is 30 μm, and an interval between the electrodes adjacent to each other in a horizontal direction is 10 μm.

Next, a polyimide resin is formed into a film having a thickness of 1.8 μm on the surface of the substrate, and is patterned, whereby a device isolation film having a width of 20 μm is formed at the position of a circumferential portion surrounding each of the first electrodes. After the substrate has been subjected to UV/ozone cleaning, N,N'-α-dinaphthylbenzidine (α-NPD) having a thickness of 50 nm is deposited so as to serve as a hole transporting layer.

Next, a mask having a shape shown in each of FIGS. 2A to 2C with a slit width of 71 μm is superimposed on the substrate, and a mixed vacuum deposited film containing an iridium-phenylpyridine complex (Ir(ppy)$_3$) and 4,4'-N,N'-dicarbazolebiphenyl (CBP) at a deposited weight ratio of 14:86 and having a thickness of 40 nm, is formed so as to overlap the first electrode of a red sub-pixel, whereby a red light emitting layer is obtained.

The same mask is shifted in the surface of the substrate, and a mixed vacuum deposited film containing coumarin 6 (1.0 vol %) and tris[8-hydroxyquinolinato]aluminum (Alq3) at a deposited weight ratio of 1:99 and having a thickness of 30 nm, is formed so as to overlap the first electrode of a green sub-pixel, whereby a green light emitting layer is obtained.

Further, the same mask is shifted in the surface of the substrate, and a mixed vacuum deposited film containing perylene and tris[8-hydroxyquinolinato]aluminum (Alq3) at a deposited weight ratio of 1:99 and having a thickness of 40 nm, is formed so as to overlap the first electrode of a blue sub-pixel, whereby a blue light emitting layer is obtained.

Next, bathophenanthroline (Bphen) represented by the following formula is formed into an electron transporting layer having a thickness of 10 nm. Further, a mixed vacuum deposited film containing cesium carbonate and Bphen (at a deposited weight ratio of 1:99) is deposited to have a thickness of 40 nm, whereby an electron injecting layer is obtained.

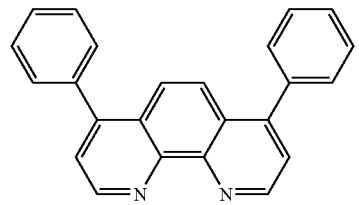

Further, an indium tin oxide having a thickness of 250 nm is deposited to serve as a second electrode. Finally, under a nitrogen atmosphere, the substrate is covered with a glass cap to which a desiccant has been attached, and is sealed with a UV-curable resin.

EXAMPLE 2

Another production example of the image display panel of the present invention will be described.

An image display portion obtained by arraying 960 columns×240 rows of active matrix drive circuits in accordance with FIG. 9 on a glass substrate, and a silicon TFT substrate on which the latch array 406, and the shift registers 405 and 407 shown in FIG. 10 have been formed are produced. Each of the data signal lines 411 connects a blue sub-pixel in an odd row and a red sub-pixel in an even row, a green sub-pixel in an odd row and a blue sub-pixel in an even row, or a red sub-pixel in an odd row and a green sub-pixel in an even row in the vertical direction. An insulating/planarizing layer made of an acrylic resin is superimposed on the surface of the image display portion. An Ag alloy (AgPdCu) layer having a thickness of 100 nm and connected to each of the driver transistors through a through-hole opened in the acrylic resin layer is deposited. Further, an indium zinc oxide IZO having a thickness of 20 nm is deposited, and is patterned in the shape shown in FIG. 1, whereby a first electrode is obtained.

Further, a device isolation film formed of an acrylic resin is formed around the first electrode by patterning, and the resultant is subjected to a heat treatment, left standing to cool, and subjected to UV/ozone cleaning. After that, a mask with a pattern shown in FIG. 2C is superimposed on the resultant, and Compound (I) represented by the following formula is deposited in a vacuum so as to serve as a hole transporting layer having a thickness of 50 nm for a red sub-pixel, a hole transporting layer having a thickness of 30 nm for a green sub-pixel, or a hole transporting layer having a thickness of 20 nm for a blue sub-pixel; the vacuum deposition is performed by shifting the mask by a pitch of one sub-pixel.

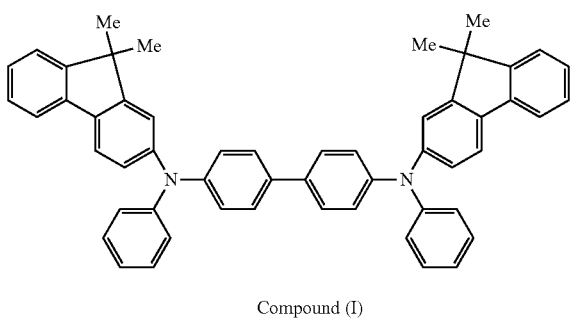

Compound (I)

Next, red, green, and blue (R, G, and B) light emitting layers are each formed as a light emitting layer by using the mask. The R light emitting layer is formed as follows: a mixture of CBP as a host and a phosphorescent compound BtpIr(acac) is deposited in a vacuum, whereby a light emitting layer having a thickness of 60 nm is obtained. The G light emitting layer is formed as follows: a mixture of Alq3 as a host and a luminous compound coumarin 6 is deposited in a vacuum, whereby a light emitting layer having a thickness of 40 nm is obtained. The B light emitting layer is formed as follows: a mixture of Compound (II) represented by the following formula as a host and Luminous Compound (III) represented by the following formula is deposited in a vacuum, whereby a light emitting layer having a thickness of 20 nm is obtained.

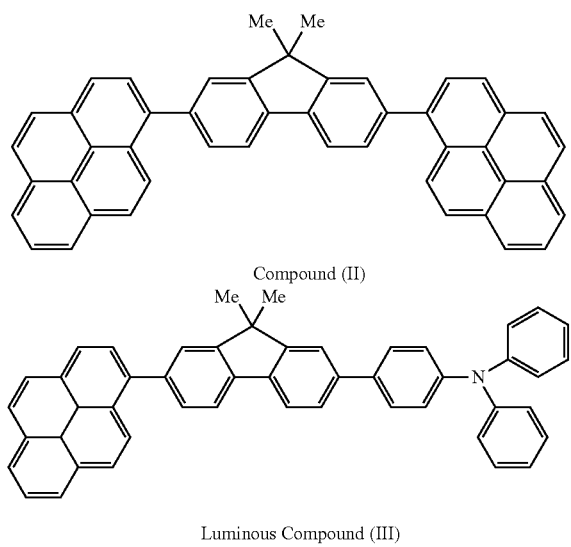

Compound (II)

Luminous Compound (III)

Further, bathophenanthroline (Bphen) is formed into a common electron transporting layer having a thickness of 10 nm by a vacuum deposition method. The deposition is performed under the following conditions: a degree of vacuum of $1 \times 10^{-4}$ Pa and a deposition rate of 0.2 nm/sec. Next, a mixture of Bphen and cesium carbonate (at a weight ratio of 90:10) is deposited in a vacuum, whereby a common electron injecting layer having a thickness of 20 nm is formed.

An ITO transparent electrode having a thickness of 60 nm is formed on the resultant so as to serve as the transparent cathode 104. Further, silicon oxynitride is formed into a protective film having a thickness of 700 nm, whereby the image display panel is obtained.

EXAMPLE 3

A production example of the image display apparatus of the present invention will be described. The display control portion 402 shown in FIG. 10 is connected to the image display panel of Example 2. The controller 409 outputs a V start pulse, and then computes the brightness of each sub-pixel in the first row of the display portion 403 with reference to the video signal conversion memory 408.

Next, the controller 409 outputs a reset signal for the H shift register. After that, the controller 409 sequentially and serially outputs data on the brightness of each sub-pixel determined by the calculation together with an H shift clock. After the completion of output for one row, the controller 409 outputs a V shift clock to carry out the same treatment as that described above for the next row.

After the completion of a treatment for the final row, the controller 409 waits for a predetermined time period, and repeats again the same operation commencing on the output of a V start pulse as that described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2007-097408, filed Apr. 3, 2007, and No. 2008-057395, filed Mar. 7, 2008, which are hereby incorporated by reference herein in their entirety.

PART LIST

- 101 substrate
- 102 first electrode
- 103 organic compound layer
- 104 second electrode
- 105 sub-pixel
- 110 device isolation film
- 111 protective layer
- 201 mask
- 202 through-hole
- 203 shaved portion
- 301 hole injecting layer
- 302 hole transporting layer
- 303 light emitting layer
- 304 electron transporting layer
- 305 electron injecting layer
- 401 image display panel
- 402 display control portion
- 403 display portion
- 404 pixel
- 405 H shift register
- 406 latch array
- 407 V shift register
- 408 video signal conversion memory (memory unit)
- 409 controller
- 410 selection (scanning) signal line
- 411 data signal line
- 412 power source line

What is claimed is:

1. A method of producing an organic electroluminescence type two-dimensional color image display panel having multiple pixels arrayed and each formed by arranging organic EL devices each having at least red, green, and blue luminescent colors in a certain order in a horizontal direction (h) as a group of sub-pixels, each of the organic EL devices having a first electrode, a second electrode, and an organic light emitting layer provided between the first electrode and the second electrode, and a value for a ratio k/r of a deviation amount k in the horizontal direction between a position of a center of gravity of any one of the sub-pixels and a position of a center of gravity of a sub-pixel adjacent to the sub-pixel in a vertical direction and having the same luminescent color to a repetition pitch r of sub-pixels adjacent to each other in the horizontal direction and having the same luminescent color is one of 1/2 and 1/3, comprising:

forming multiple first electrodes two-dimensionally arrayed on a substrate;

depositing an organic light emitting material having at least red, green, and blue luminescent colors at positions where the multiple first electrodes are formed through multiple through-holes of a mask having the multiple through-holes for each luminescent color; and forming a second electrode, wherein:

in the formation of the multiple first electrodes, the multiple first electrodes each having a planar shape with a pair of two parallel sides and being spaced apart from each other in every adjacent organic EL device and are one-dimensionally arrayed so that a first side of the two parallel sides of each electrode is aligned with a straight line, and a second side of the two parallel sides of the electrode is also aligned with a straight line, and the multiple first electrodes are two-dimensionally arrayed so that one-dimensional arrays of the multiple first electrodes are in a shape of stripes arranged parallel to each other while being slanted with respect to a vertical line; and in the deposition of the organic light emitting materials, the mask in which the multiple through-holes are formed into a shape of stripes to correspond to stripes obtained by forming the multiple first electrodes is aligned so that the stripes obtained by forming the multiple first electrodes and the multiple through-holes of the mask are opposed to each other before the organic light emitting materials are deposited by vacuum depositing.

2. The method of producing color image display panel according to claim 1, comprising:

forming a pixel by using the organic EL devices having at least red, green, and blue luminescent colors and arrayed to be adjacent to one another in a horizontal direction as a group of sub-pixels; and arraying the pixels adjacent to each other in the horizontal direction are arrayed so that a straight line connecting positions of centers of gravity of the pixels is parallel to a horizontal line.

3. The method of producing the color image display panel according to claim 1, wherein each of the multiple first electrodes has a shape of a parallelogram.

4. The method of producing the color image display panel according to claim 1, wherein the multiple first electrodes have a shape of a rectangle.

5. The method of producing the color image display panel according to claim 1, wherein a short side of each of the multiple first electrodes is parallel to the horizontal line.

* * * * *